US012677603B2

(12) United States Patent
Li et al.

(10) Patent No.: US 12,677,603 B2
(45) Date of Patent: Jul. 7, 2026

(54) PHASE CHANGE MATERIAL RADIO-FREQUENCY DEVICE AND METHODS FOR FORMING THE SAME

(71) Applicant: Taiwan Semiconductor Manufacturing Company Limited, Hsinchu (TW)

(72) Inventors: Hung-Ju Li, Hsinchu City (TW); Chien Ta Huang, Taoyuan (TW); Kuo-Pin Chang, Zhubei City (TW); Yu-Wei Ting, Taipei City (TW); Kuo-Ching Huang, Hsinchu City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 524 days.

(21) Appl. No.: 18/304,551

(22) Filed: Apr. 21, 2023

(65) Prior Publication Data

US 2024/0224823 A1    Jul. 4, 2024

Related U.S. Application Data

(60) Provisional application No. 63/436,620, filed on Jan. 1, 2023.

(51) Int. Cl.
H10N 70/00 (2023.01)

(52) U.S. Cl.
CPC ....... *H10N 70/8413* (2023.02); *H10N 70/063* (2023.02); *H10N 70/8613* (2023.02); *H10N 70/8828* (2023.02)

(58) Field of Classification Search
CPC .......................... H10N 70/826; H10N 70/231
See application file for complete search history.

(56) References Cited

U.S. PATENT DOCUMENTS 12,453,101 B2 * 10/2025 Hsieh ................. G11C 13/0069
2012/0097968 A1 * 4/2012 Chang ................ H10D 62/8503
257/E29.091

(Continued)

FOREIGN PATENT DOCUMENTS

TW    201800602 A    1/2018

OTHER PUBLICATIONS

Jianq Chyun Intellectual Property Office; TW Application No. 112123023; Office Action mailed Mar. 6, 2024; 10 pages.

*Primary Examiner* — Mounir S Amer
(74) *Attorney, Agent, or Firm* — The Marbury Law Group, PLLC

(57) ABSTRACT

A heater material layer is over a substrate. A reactive sputtering process is performed while the substrate and the heater material layer are placed in a process chamber. Sputtered aluminum atoms and reactive nitrogen-containing molecules react inside the process chamber to form a continuous inhomogeneous aluminum nitride layer on the heater material layer. The continuous inhomogeneous aluminum nitride layer is formed such that a top surface portion of the aluminum nitride layer has a higher atomic concentration of nitrogen than a bottom surface portion of the aluminum nitride layer contacting a top surface of the heater line. The continuous inhomogeneous aluminum nitride layer and the heater material layer are patterned into an inhomogeneous aluminum nitride layer and a heater line. A phase change material (PCM) line is formed over the aluminum nitride layer to provide a radio-frequency switch.

20 Claims, 20 Drawing Sheets

(56) References Cited

U.S. PATENT DOCUMENTS

| | | | |
|---|---|---|---|
| 2017/0365427 A1 | 12/2017 | Borodulin et al. | |
| 2020/0058862 A1* | 2/2020 | Howard | H10N 70/011 |
| 2020/0058869 A1 | 2/2020 | Slovin et al. | |
| 2021/0249597 A1* | 8/2021 | Wu | H10N 70/063 |
| 2022/0416162 A1* | 12/2022 | Philip | H10N 70/8828 |
| 2024/0224824 A1* | 7/2024 | Li | H10N 70/231 |

* cited by examiner

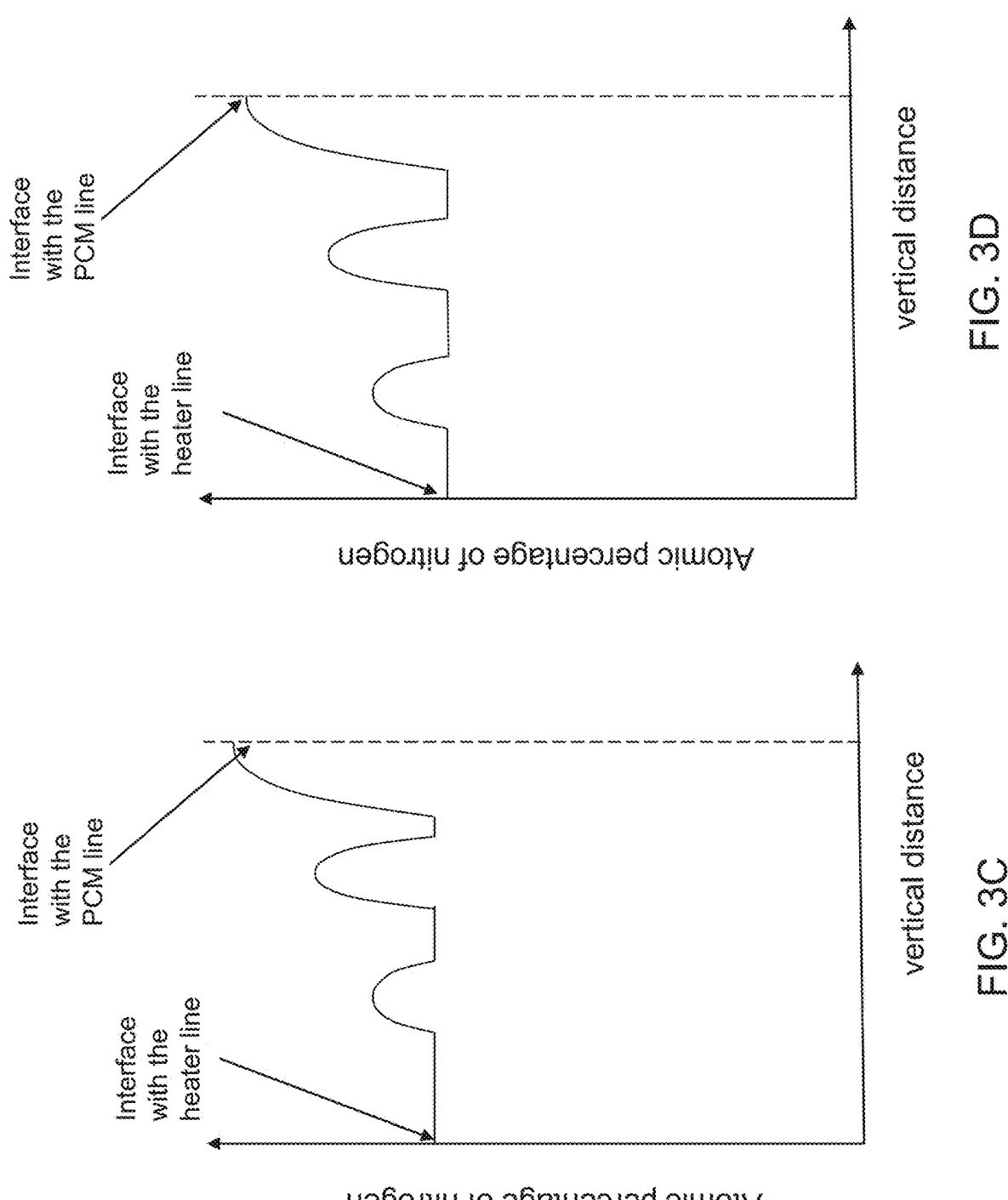

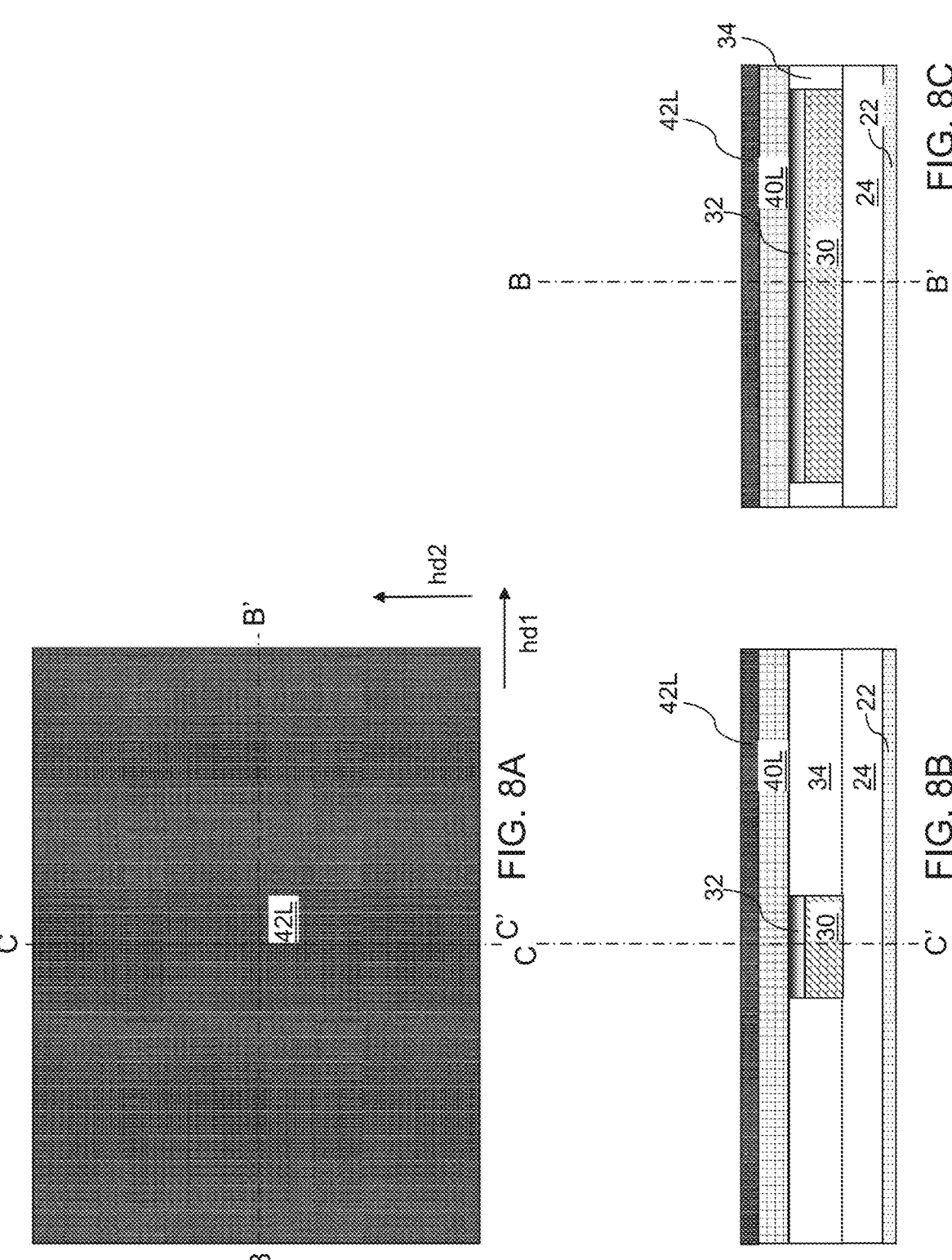

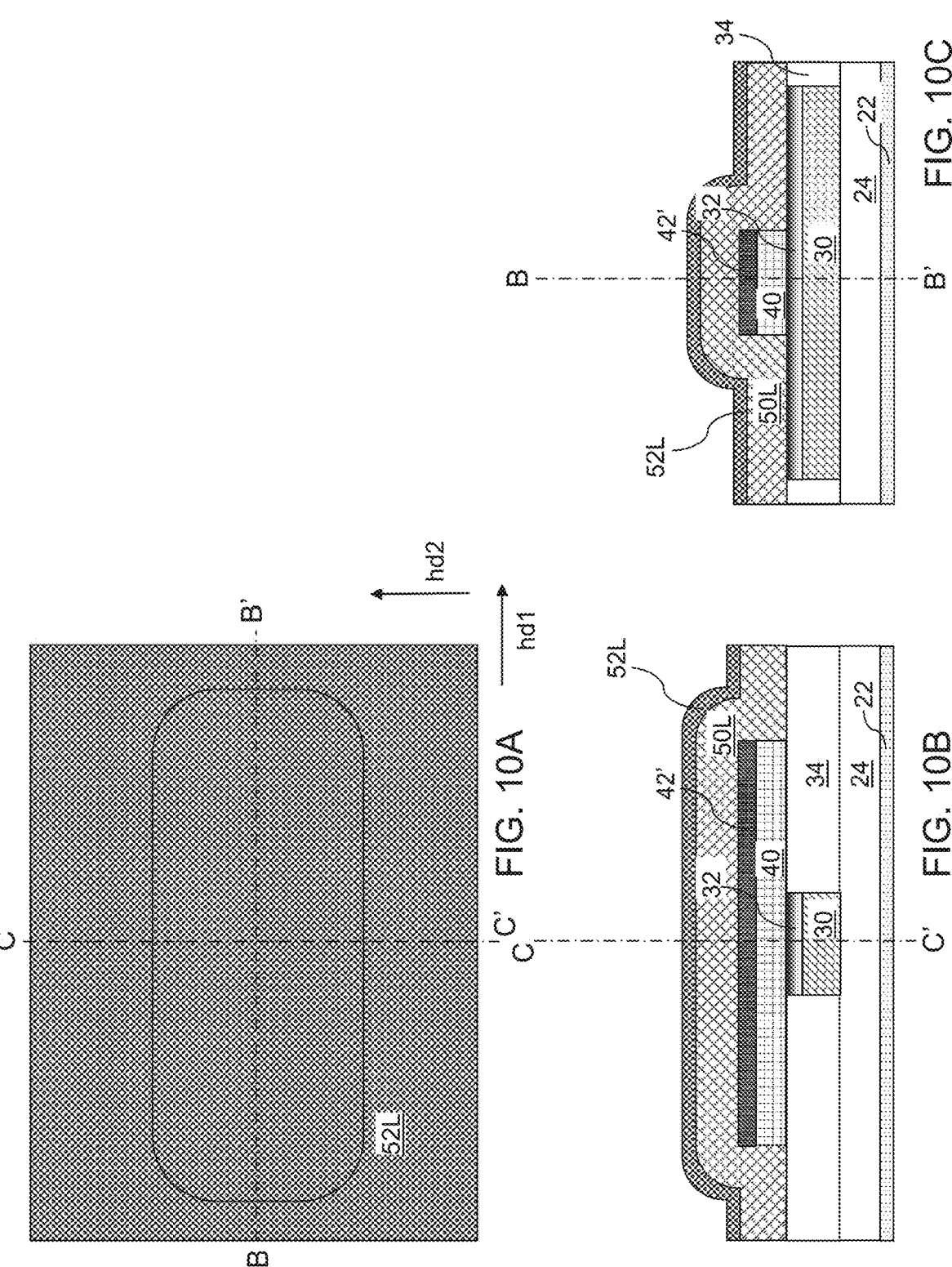

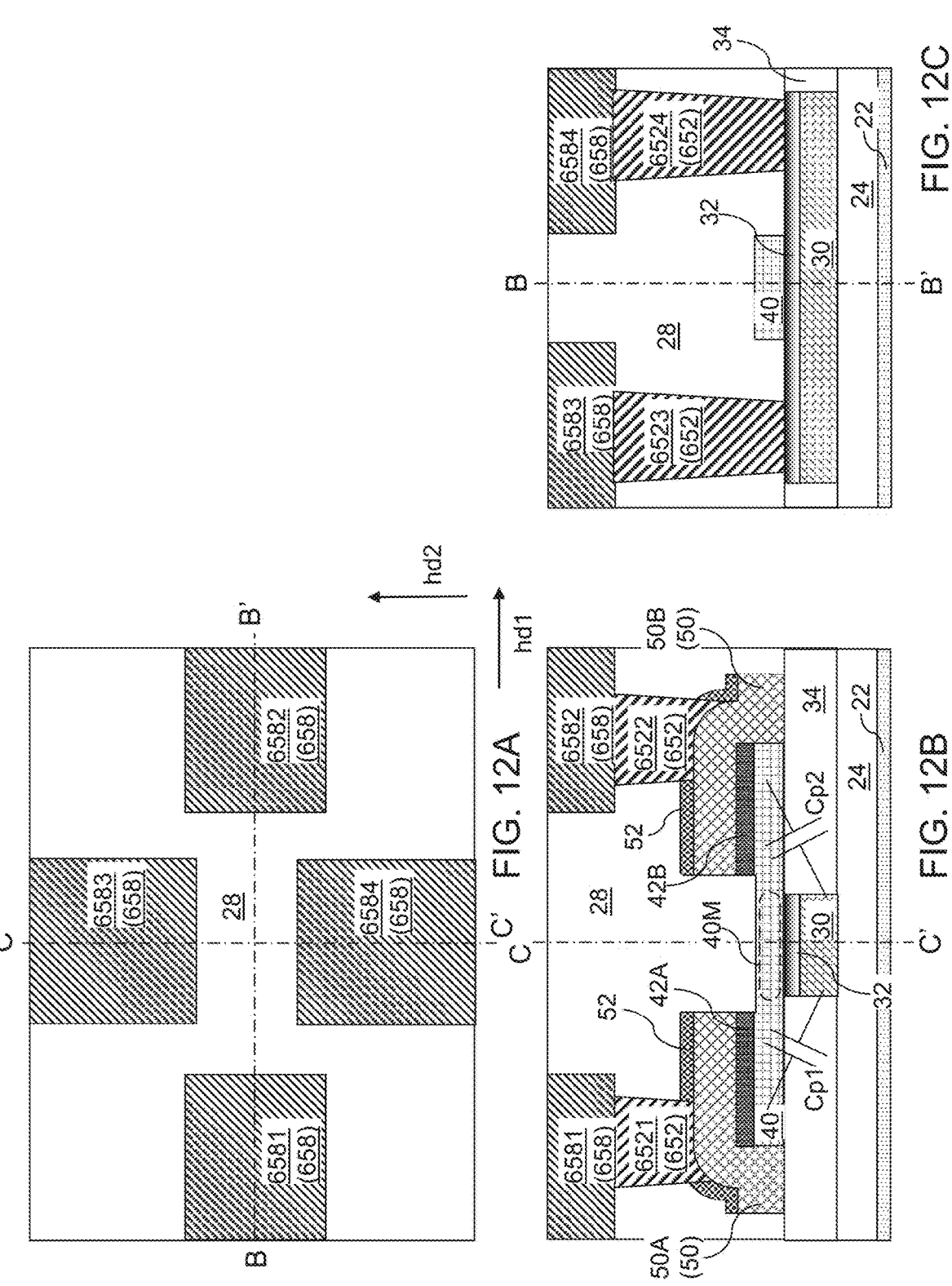

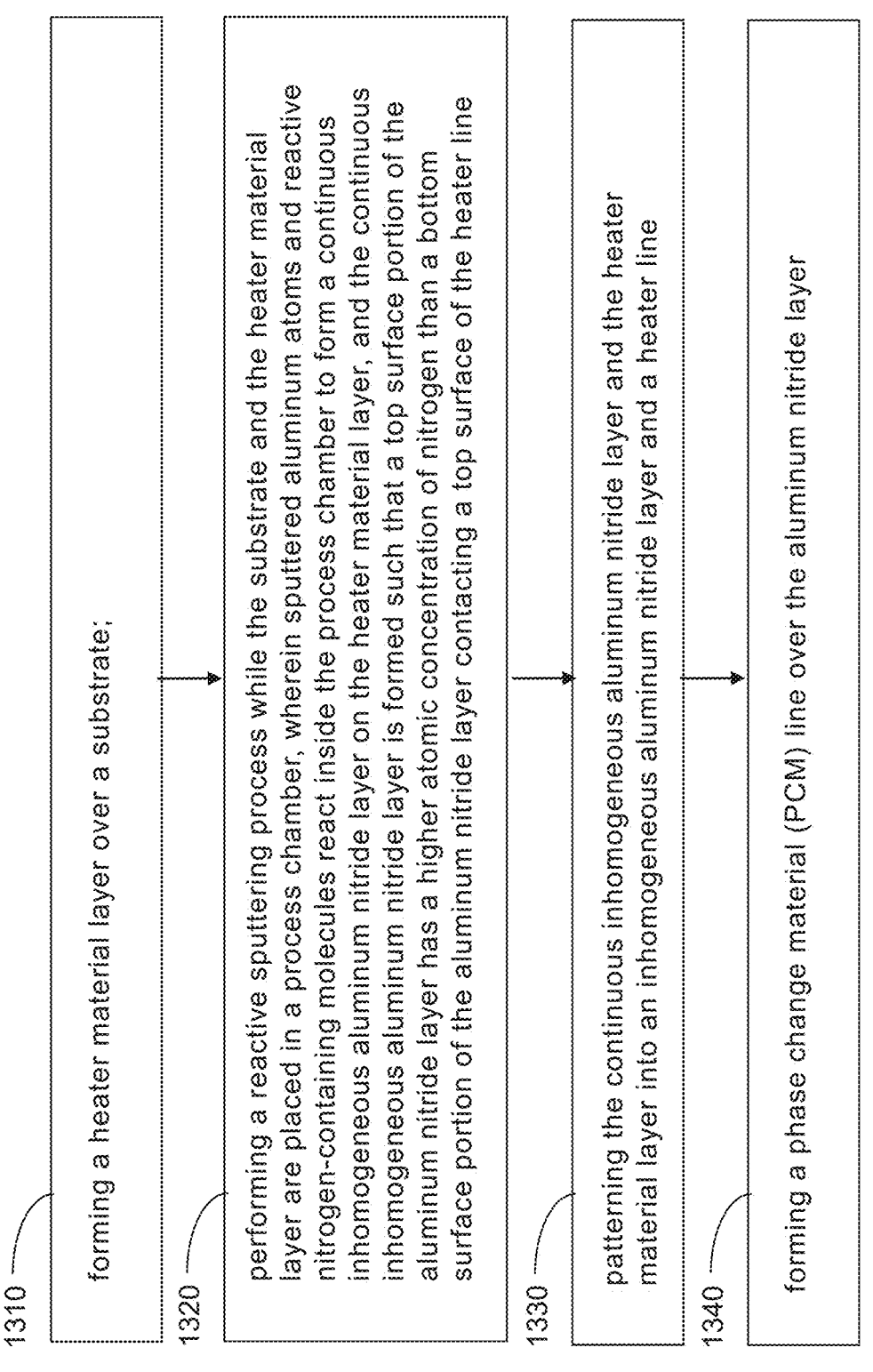

1310 — forming a heater material layer over a substrate;

1320 — performing a reactive sputtering process while the substrate and the heater material layer are placed in a process chamber, wherein sputtered aluminum atoms and reactive nitrogen-containing molecules react inside the process chamber to form a continuous inhomogeneous aluminum nitride layer on the heater material layer, and the continuous inhomogeneous aluminum nitride layer is formed such that a top surface portion of the aluminum nitride layer has a higher atomic concentration of nitrogen than a bottom surface portion of the aluminum nitride layer contacting a top surface of the heater line 1330 — patterning the continuous inhomogeneous aluminum nitride layer and the heater material layer into an inhomogeneous aluminum nitride layer and a heater line 1340 — forming a phase change material (PCM) line over the aluminum nitride layer

FIG. 13

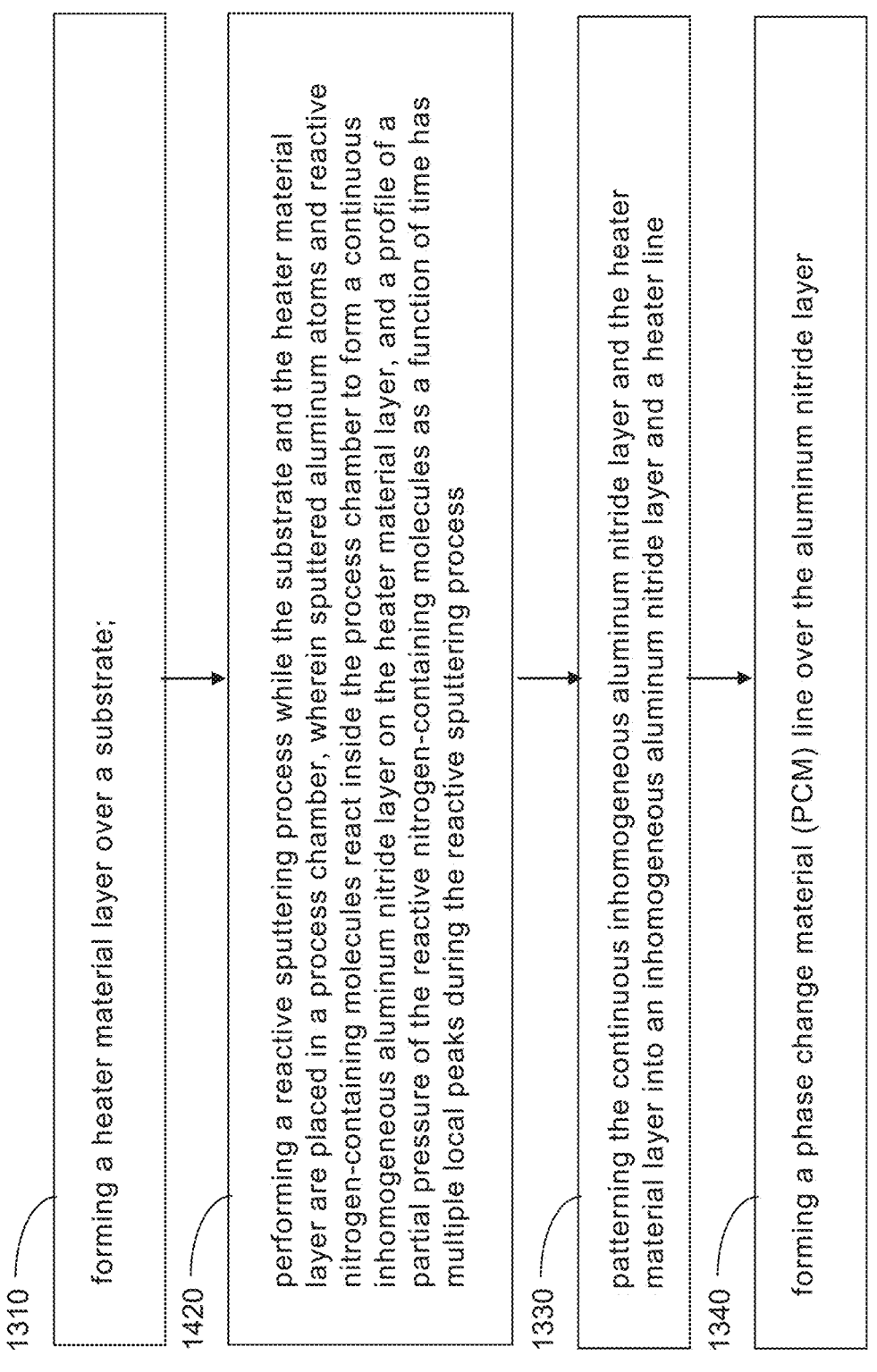

1310 — forming a heater material layer over a substrate;

1420 — performing a reactive sputtering process while the substrate and the heater material layer are placed in a process chamber, wherein sputtered aluminum atoms and reactive nitrogen-containing molecules react inside the process chamber to form a continuous inhomogeneous aluminum nitride layer on the heater material layer, and a profile of a partial pressure of the reactive nitrogen-containing molecules as a function of time has multiple local peaks during the reactive sputtering process 1330 — patterning the continuous inhomogeneous aluminum nitride layer and the heater material layer into an inhomogeneous aluminum nitride layer and a heater line 1340 — forming a phase change material (PCM) line over the aluminum nitride layer

FIG. 14

PHASE CHANGE MATERIAL RADIO-FREQUENCY DEVICE AND METHODS FOR FORMING THE SAME

RELATED APPLICATIONS

This application claims priority from U.S. Provisional Application Ser. No. 63/436,620 entitled "Phase Change Material Radio-Frequency Device And Methods For Forming The Same," filed on Jan. 1, 2023, the entire contents of which are incorporated herein by reference for all purposes.

BACKGROUND

Phase change material switches are useful devices that may mitigate against interference due to electromagnetic radiation, and may be used for various applications such as radio-frequency applications. The phase change material switches may provide electrical connection or electrical isolation in the path of radio-frequency signals depending on the resistivity state of a phase change material portion.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3F are graphs of the atomic percentage of nitrogen as a function of a vertical distance within various configurations of the continuous inhomogeneous aluminum nitride layer according to embodiments of the present disclosure.

FIG. 6A is a top-down view, and FIGS. 6B and 6C are vertical cross-sectional views along the vertical plane B-B' or C-C' of FIG. 6A, respectively.

FIG. 7A is a top-down view, and FIGS. 7B and 7C are vertical cross-sectional views along the vertical plane B-B' or C-C' of FIG. 7A, respectively.

FIGS. 8A-8C are various views of the exemplary structure after formation of a phase change material layer and a conductive barrier material layer according to an embodiment of the present disclosure. FIG. 8A is a top-down view, and FIGS. 8B and 8C are vertical cross-sectional views along the vertical plane B-B' or C-C' of FIG. 8A, respectively.

FIG. 9A is a top-down view, and FIGS. 9B and 9C are vertical cross-sectional views along the vertical plane B-B' or C-C' of FIG. 9A, respectively.

FIGS. 10A-10C are various views of the exemplary structure after formation of an electrode material layer and an electrode-capping dielectric layer according to an embodiment of the present disclosure. FIG. 10A is a top-down view, and FIGS. 10B and 10C are vertical cross-sectional views along the vertical plane B-B' or C-C' of FIG. 10A, respectively.

FIG. 11A is a top-down view, and FIGS. 11B and 11C are vertical cross-sectional views along the vertical plane B-B' or C-C' of FIG. 11A, respectively.

FIGS. 12A-12C are various views of the exemplary structure after formation of a dielectric material layer and additional metal interconnect structures according to an embodiment of the present disclosure. FIG. 12A is a top-down view, and FIG. 12B and FIG. 12C are vertical cross-sectional views along the vertical plane B-B' or C-C' of FIG. 12A, respectively.

FIG. 13 is a first flowchart that illustrates general processing steps for manufacturing the semiconductor devices according to an embodiment of the present disclosure.

FIG. 14 is a second flowchart that illustrates general processing steps for manufacturing the semiconductor devices according to an embodiment of the present disclosure.

DETAILED DESCRIPTION

Figure 1:
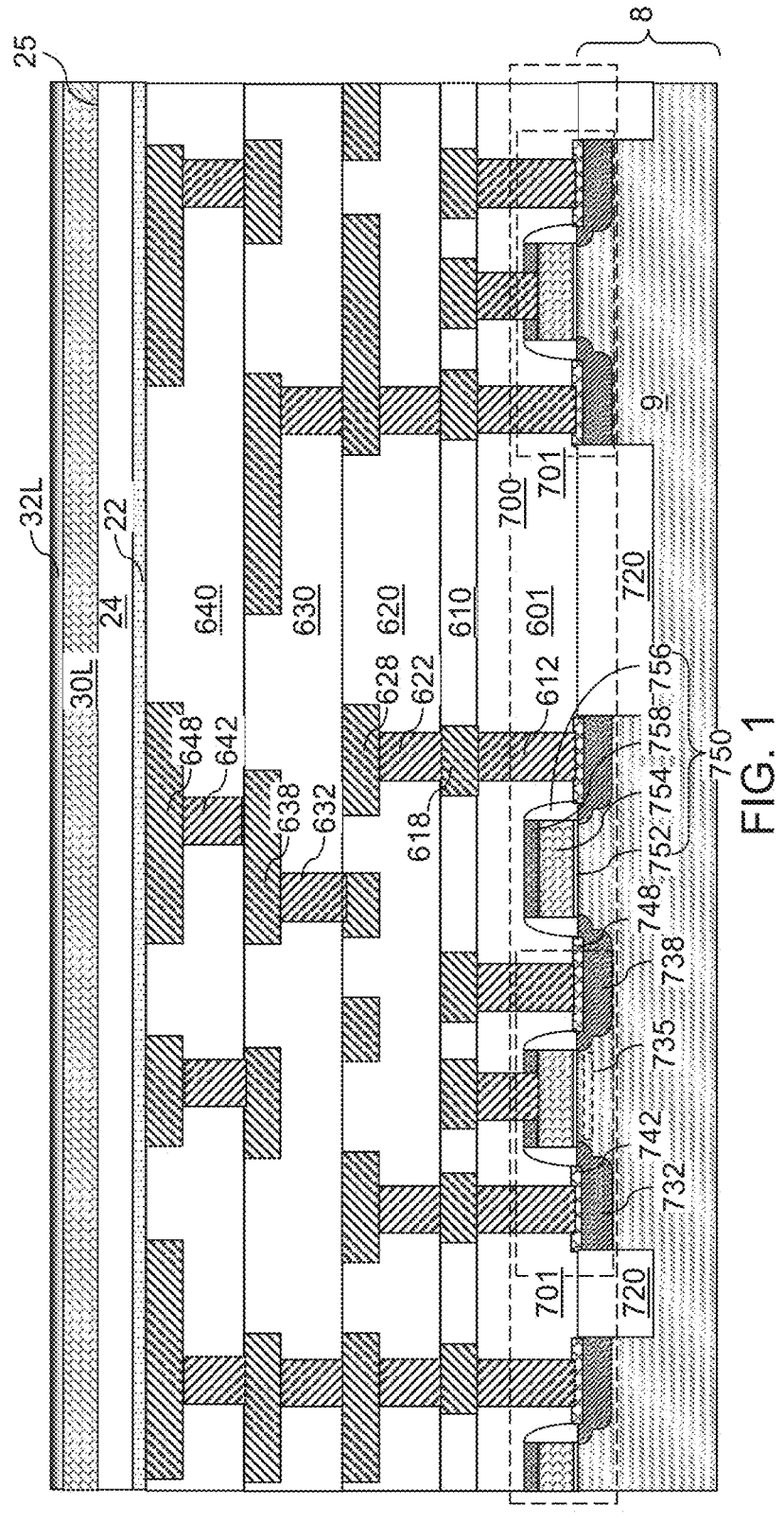
FIG. 1 is a vertical cross-sectional view of a exemplary structure after formation of complementary metal-oxide-semiconductor (CMOS) transistors, metal interconnect structures and dielectric material layers, an optional dielectric capping layer, a dielectric isolation layer, a heater material layer, and a continuous inhomogeneous (i.e., gradient) aluminum nitride layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the various embodiment structures and methods disclosed herein may be used to form a phase change material (PCM) switch. Such embodiment PCM switches may be used to provide a switching function for various semiconductor devices such as radio-frequency semiconductor devices, varactors (i.e., variable capacitance capacitors), inductors, or other semiconductor devices. In one embodiment, a PCM switch may be used as a radio-frequency switch having low parasitic capacitive coupling between an input electrode and an output electrode at high frequencies, such as frequencies higher than 1 GHz.

Various embodiments disclosed herein may provide a switch device including a heater line, an inhomogeneous aluminum nitride layer (i.e., having a gradient concentration ratio of aluminum and nitrogen), and a phase change material (PCM) line straddling the inhomogeneous aluminum nitride layer and connected to two electrodes at opposite ends. Aluminum nitride may exhibit a different thermal conductivity and a different electrical conductivity depending on the nitrogen content. Specifically, an aluminum nitride material having a high nitrogen content may exhibit properties of a dielectric such as low thermal conductivity and low electrical conductivity. In contrast, an aluminum nitride material having a low nitrogen content may exhibit properties of a metal such as high thermal conductivity and high electrical conductivity. A heater element for operation of a phase change material (PCM) device may be thermally coupled to a phase change material, but may also be electrically isolated from the phase change material. The inhomogeneous aluminum nitride layer in various embodiments disclosed herein may use high electrical conductivity and high thermal conductivity of a low-nitrogen-content aluminum nitride material at a bottom portion to provide high electrical conductivity and to reduce interfacial electrical resistance and to spread the heat generated from a heater line over a wide region. In addition, the inhomogeneous aluminum nitride layer in various embodiments disclosed herein may use low electrical conductivity and low thermal conductivity of a high-nitrogen-content aluminum nitride material at a top portion to provide sufficient electrical isolation between the heater line and the phase change material.

Further, the inhomogeneous aluminum nitride layer in various embodiments disclosed herein may be formed using a single reactive sputtering process in which the partial pressure of reactive nitrogen-containing molecules is modulated. Specifically, the partial pressure of reactive nitrogen-containing molecules may be increased monotonically, strictly, stepwise, or with multiple peaks provided that the top portion of the inhomogeneous aluminum nitride layer has a higher average nitrogen atomic concentration than the bottom portion of the inhomogeneous aluminum nitride layer. Thus, the inhomogeneous aluminum nitride layer may be formed in a single processing step using a single deposition tool. Moreover, the change to the total manufacturing cost for the inhomogeneous aluminum nitride layer in various embodiments disclosed herein due to the non-uniform vertical nitrogen concentration profile may be minimal.

The inhomogeneous aluminum nitride layer may reduce internal electrical and thermal resistance to provide more effective heat transfer from a heater line to a phase change material (PCM) line during operation of a switch device. Consequently, the temperature of the heater line that is used to elevate the temperature of a proximal portion of the PCM line to a target melting temperature may be lower for a switch device of various embodiments that use an inhomogeneous aluminum nitride layer. Thus, the inhomogeneous aluminum nitride layer may reduce the power consumption of various embodiment switch devices during switching operations. Alternatively or additionally, the inhomogeneous aluminum nitride layer of the various embodiments disclosed herein may provide the functionality of effective thermal conduction and electrical isolation at a higher thickness than interfacial layers used in related art, and thus may decrease the parasitic capacitive coupling between the heater line and two end portions of the PCM line. Reduced capacitive coupling may decrease signal coupling during the off state of the switch device, which is a desirable device characteristic for the switch device. The various embodiments of the present disclosure are now described with reference to accompanying drawings.

Referring to FIG. 1, an exemplary structure according to a first embodiment of the present disclosure is illustrated. The exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738. The devices formed on the top surface of the semiconductor material layer 9 may include complementary metal-oxide-semiconductor (CMOS) transistors and optionally additional semiconductor devices (such as resistors, diodes, capacitor structures, etc.), and are collectively referred to as CMOS circuitry 700.

One or more of the field effect transistors 701 in the CMOS circuitry 700 may include a semiconductor channel

735 that contains a portion of the semiconductor material layer 9 in the substrate 8. In embodiments in which the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a subset of the field effect transistors 701 in the CMOS circuitry 700 may include a respective node that is subsequently electrically connected to a node of an energy harvesting device and/or to a battery structure to be subsequently formed.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant.

Various metal interconnect structures formed within dielectric material layers may be subsequently formed over the substrate 8 and the semiconductor devices 701 thereupon (such as field effect transistors). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, a second interconnect-level dielectric material layer 620, a third interconnect-level dielectric material layer 630, and a fourth interconnect-level dielectric material layer 640. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, second metal line structures 628 formed in an upper portion of the second interconnect-level dielectric material layer 620, second metal via structures 632 formed in a lower portion of the third interconnect-level dielectric material layer 630, third metal line structures 638 formed in an upper portion of the third interconnect-level dielectric material layer 630, third metal via structures 642 formed in a lower portion of the fourth interconnect-level dielectric material layer 640, and fourth metal line structures 648 formed in an upper portion of the fourth interconnect-level dielectric material layer 640. While the present disclosure is described using an embodiment in which four levels metal line structures are formed in dielectric material layers, embodiments are expressly contemplated herein in which a lesser or greater number of levels of metal line structures are formed in dielectric material layers.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. Generally, any contiguous set of a metal line structure (628, 638, 648) and at least one underlying metal via structure (622, 632, 642) may be formed as an integrated line and via structure.

Generally, semiconductor devices 701 may be formed on a substrate 8, and metal interconnect structures (612, 618, 622, 628, 632, 638, 642, 648) and dielectric material layers (601, 610, 620, 630, 640) may be formed over the semiconductor devices 701. The metal interconnect structures (612, 618, 622, 628, 632, 638, 642, 648) may be formed in the dielectric material layers (601, 610, 620, 630, 640), and may be electrically connected to the semiconductor devices.

An optional dielectric capping layer 22, a dielectric isolation layer 24, and a heater material layer 30L, and a continuous inhomogeneous aluminum nitride layer 32L may be deposited over the metal interconnect structures (612, 618, 622, 628, 631, 638, 642, 648) and dielectric material layers (601, 610, 620, 630, 640). The optional dielectric capping layer 22 includes a dielectric capping material such as silicon carbide, silicon nitride, or silicon carbide nitride. Other suitable dielectric capping materials are within the contemplated scope of disclosure. The thickness of the optional dielectric capping layer 22, if present, may be in a range from 2 nm to 100 nm, although lesser and greater thicknesses may also be used. The dielectric isolation layer 24 comprises a dielectric material such as undoped silicate glass or a doped silicate glass. The dielectric isolation layer 24 may comprise a planar top surface, i.e., a top surface located entirely within a horizontal plane. The thickness of the dielectric isolation layer 24 may be in a range from 100 nm to 300 nm, such as from 120 nm to 200 nm, although lesser and greater thicknesses may also be used.

The heater material layer 30L includes a metallic material having a lower electrical conductivity than copper or aluminum. In one embodiment, the heater material layer 30L may comprise a refractory elemental metal such as tungsten, rhenium, tantalum, molybdenum, or niobium, or may comprises a conductive metallic nitride material such as tungsten nitride, titanium nitride, or tantalum nitride. In another embodiment and according to an aspect of the present disclosure, the heater material layer 30L comprises an aluminum-nitrogen alloy such as an aluminum nitride material or a mixture of aluminum and aluminum nitride material. In some embodiments, the heater material layer 30L may be formed by co-sputtering of an aluminum target and an aluminum nitride target. In one embodiment, nanoscale grains of aluminum and aluminum nitride may be mixed within the heater material layer. In some other cases, the heater material layer 30L may be formed by performing a reactive sputtering process in which aluminum is sputtered in a nitridation ambient. In this embodiment, the atomic percentage of nitrogen in a homogeneous aluminum nitride material within the heater material layer 30L may be in a range from 0.001% to 50.000%. In one embodiment, the atomic percentage of nitrogen may be optimized to provide optimal electrical resistivity within the heater material layer 30L. In one embodiment, the atomic percentage of nitrogen may have a vertical gradient such that the atomic percentage of nitrogen decrease with a vertical distance from the substrate 8, and heat generation is greater at an upper portion of a heater line to be patterned from the heater material layer 30L than at a lower portion of the heater line. This type of atomic concentration gradient is more effective in providing heat to a phase change material line to be subsequently formed. In one embodiment, the top portion of the heater material layer 30L may have an atomic concentration of nitrogen that is less than 40%, and/or less than 30%, and/or less than 20%, and/or less than 10%; and is greater than 0.001% and/or greater than 2.5%, and/or greater than 5%, and/or greater than 10%, and/or greater than 20%. In one embodiment, the bottom portion of the heater material layer 30L may have an atomic concentration of nitrogen that is the same or less than 50%, and/or less than 49%, and/or less than 48%; and is greater than 40% and/or greater than 45%, and/or greater than 48%, and/or greater than 49%. Other suitable heater materials are within the contemplated scope of disclosure. The thickness of the heater material layer 30L may be in a range from 50 nm to 300 nm, such as from 100 nm to 200 nm, although lesser and greater thicknesses may also be used.

The continuous inhomogeneous aluminum nitride layer 32L may be formed on, and over, a top surface of the heater material layer 30L. The continuous inhomogeneous aluminum nitride layer 32L is an aluminum nitride layer that extends continuously as a blanket material layer, and is inhomogeneous in material composition along the vertical direction. The continuous inhomogeneous aluminum nitride layer 32L comprises an inhomogeneous aluminum nitride material having a vertical compositional gradient therein. As will be described below, the continuous inhomogeneous aluminum nitride layer 32L may have various types of compositional profiles along the vertical direction. Generally, the bottom portion of the continuous inhomogeneous aluminum nitride layer 32L has a lower average atomic percentage or nitrogen atoms than the upper portion of the continuous inhomogeneous aluminum nitride layer 32L. The continuous inhomogeneous aluminum nitride layer 32L may be formed, for example, by a reactive sputtering process that is described in detail in subsequently sections. The thickness of the continuous inhomogeneous aluminum nitride layer 32L may be in a range from 10 nm to 100 nm, such as from 20 nm to 60 nm, although lesser and greater thicknesses may also be used.

Generally, stoichiometric aluminum nitride material includes nitrogen atoms at an atomic percentage of 50%, and provides thermal conductivity in a range from 70 W/(m·K) to 200 W/(m·K) while providing low electrical conductivity in a range from 10 Ω·m to 16 Ω·m, thus, functioning as an electrically insulating material. Non-stoichiometric aluminum nitride used in embodiments of the present disclosure is nitrogen deficient, and thus, includes nitrogen atoms at an atomic percentage less than 50%, which may be in a range from 45% to less than 50%, such as from 48% to 49.9%.

FIGS. 2A-2F are magnified vertical cross-sectional views of a region of the exemplary structure for various configurations of the continuous inhomogeneous aluminum nitride layer 32L according to embodiments of the present disclosure. FIGS. 3A-3F are graphs of the atomic percentage of nitrogen as a function a vertical distance within various configurations of the continuous inhomogeneous aluminum nitride layer 32L according to embodiments of the present disclosure. FIGS. 4A-4F are graphs of the partial pressure of reactive nitrogen-containing molecules as a function of time during a reactive sputtering process that is used to deposit the continuous inhomogeneous aluminum nitride layer 32L.

Figure 2B:
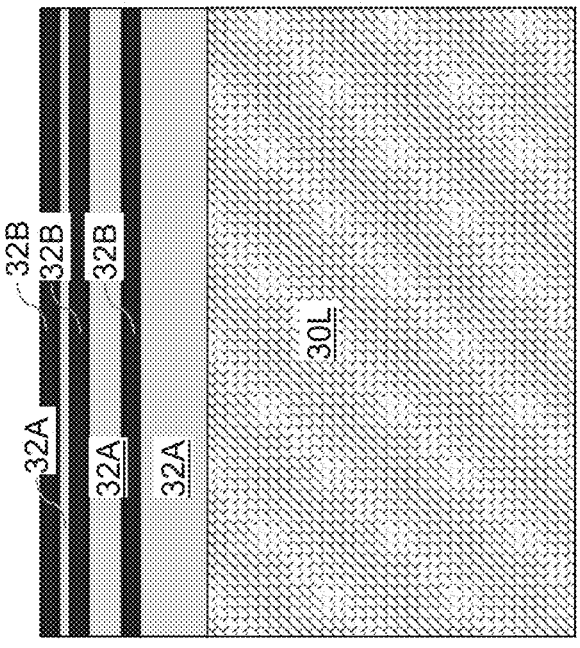
FIGS. 2A-2F are magnified vertical cross-sectional views of a region of the exemplary structure for various configurations of the continuous inhomogeneous aluminum nitride layer according to embodiments of the present disclosure.
Figure 2A:
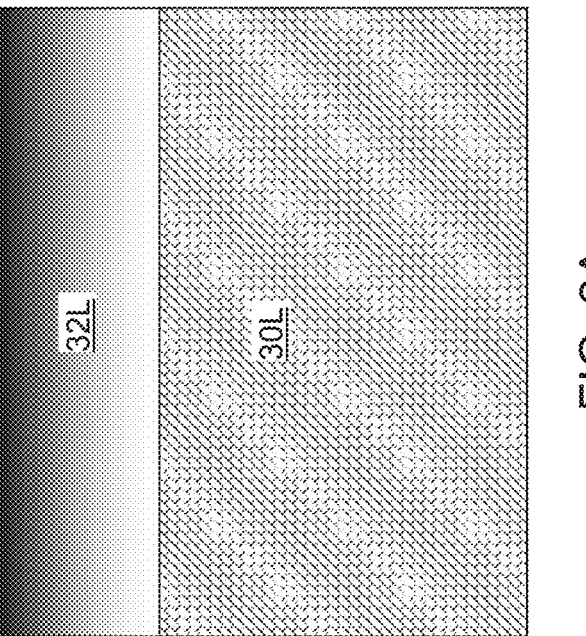
Figures 3A, 3B:
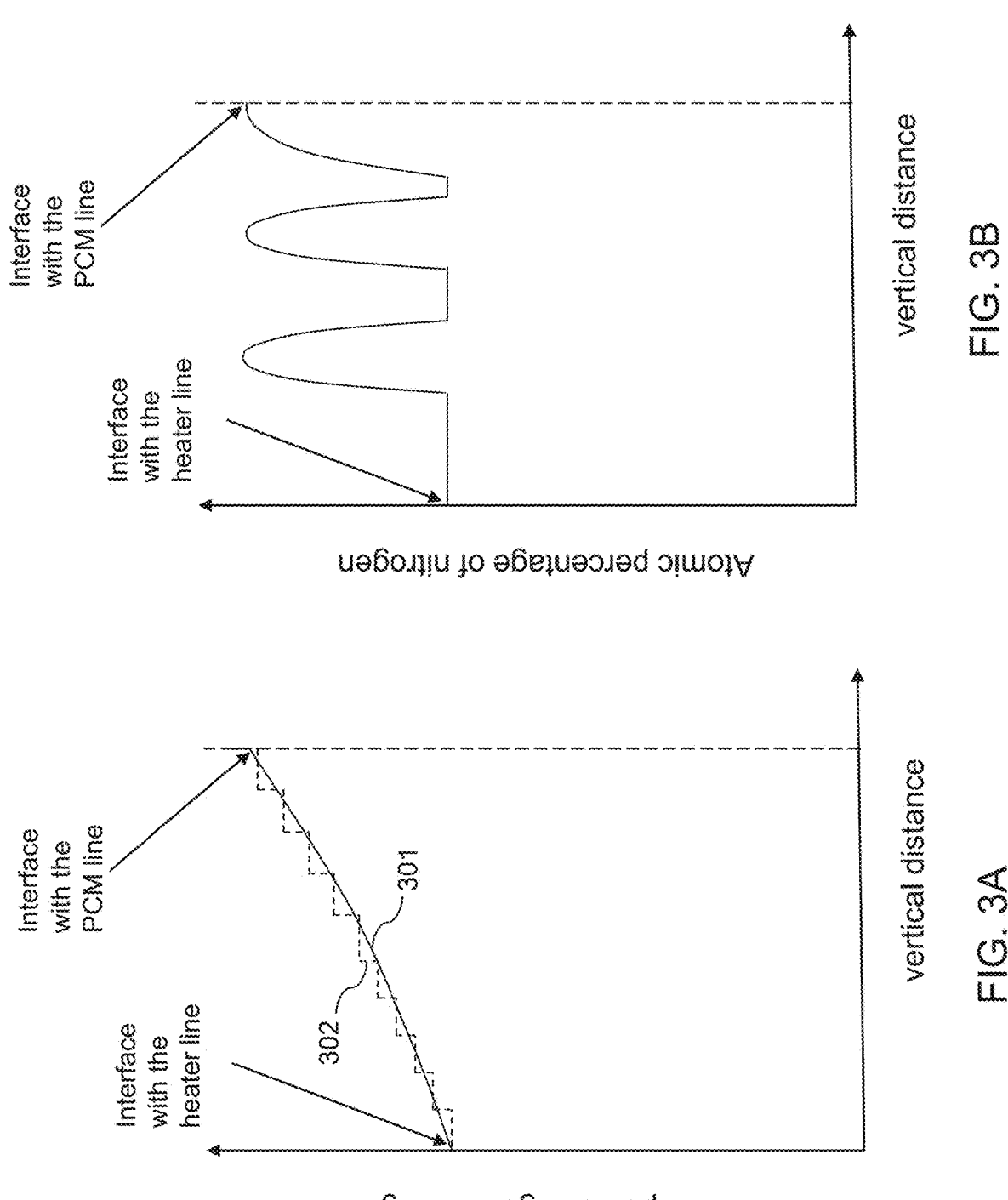
Figures 4A, 4B:
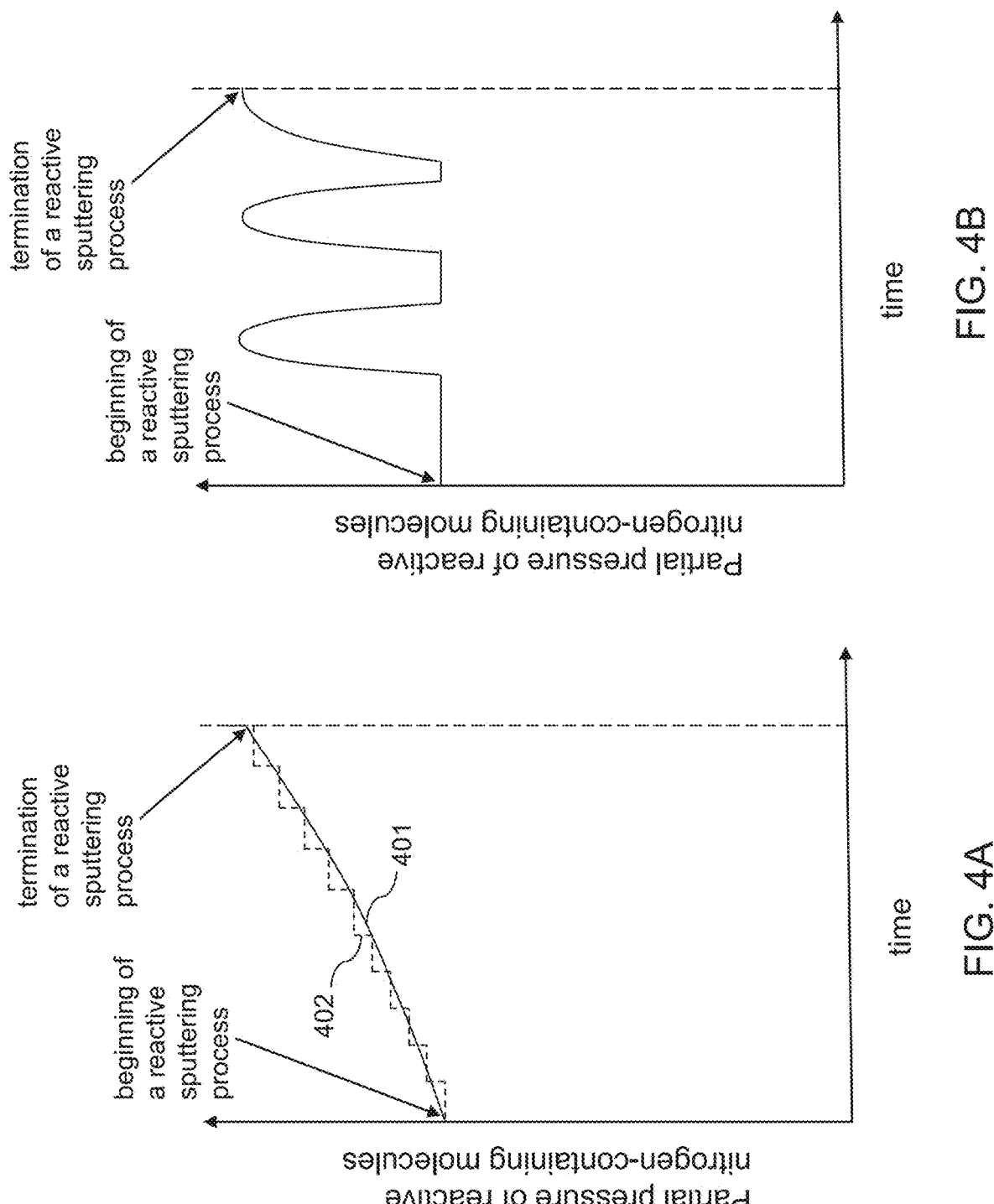
FIGS. 4A-4F are graphs of the partial pressure of reactive nitrogen-containing molecules as a function of time during a reactive sputtering process according to embodiments of the present disclosure.

Referring to FIGS. 2A, 3A, and 4A, a first configuration of the continuous inhomogeneous aluminum nitride layer 32L, the vertical cross-sectional profile of the atomic percentage of nitrogen in the first configuration of the continuous inhomogeneous aluminum nitride layer 32L, and a graph representing the partial pressure of reactive nitrogen-containing molecules as a function of time during a reactive sputtering process used to deposit the first configuration of the continuous inhomogeneous aluminum nitride layer 32L are shown, respectively.

The first configuration of the continuous inhomogeneous aluminum nitride layer 32L is formed such that a top surface portion of the continuous inhomogeneous aluminum nitride layer 32L has a higher atomic concentration of nitrogen than a bottom surface portion of the continuous inhomogeneous aluminum nitride layer 32L contacting a top surface of the heater material layer 30L. In one embodiment, the atomic percentage of nitrogen within the continuous inhomogeneous aluminum nitride layer 32L increases monotonically as a function of a vertical distance from a top surface of the heater material layer 30L. As used herein, a function is "monotonically increasing" with a variable in instances in which, for each pair of values for the variable including a first value and a second value that is greater than the first value, the value of the function for the second value of the variable is not less than (i.e., greater than or the same as) the value of the function for the first value of the variable. In other words, the function does not have any segment in which the value of the function decreases.

In one embodiment, the atomic percentage of nitrogen within the continuous inhomogeneous aluminum nitride layer 32L increases strictly as a function of a vertical distance from a top surface of the heater material layer 30L. As used herein, a function is "strictly increasing" with a variable in instances in which, for each pair of values for the variable including a first value and a second value that is greater than the first value, the value of the function for the second value of the variable is greater than the value of the function for the first value of the variable. In other words, the function is increasing in each interval that may be defined for the values of the variable. Thus, each first point within the continuous inhomogeneous aluminum nitride layer 32L has a greater atomic concentration of nitrogen atoms than any second point within the continuous inhomogeneous aluminum nitride layer 32L that is more proximal to the heater material layer 30L. In one embodiment, the continuous inhomogeneous aluminum nitride layer 32L may be formed with a vertical nitrogen concentration gradient such that an atomic percentage of nitrogen atoms in the continuous inhomogeneous aluminum nitride layer 32L increases continuously, i.e., increases strictly, from an interface with the heater material layer 30L to the top surface of the continuous inhomogeneous aluminum nitride layer 32L.

In one embodiment (represented by a curve 301 in FIG. 3A and by a curve 401 in FIG. 4A), the continuous inhomogeneous aluminum nitride layer 32L may be deposited using a deposition process in which the supply of nitrogen molecules (which may be measured by the partial pressure of reactive nitrogen-containing molecules during a reactive sputtering process) increases continuously as illustrated in curve 401 in FIG. 4A, and the atomic percentage of nitrogen in the continuous inhomogeneous aluminum nitride layer 32L increases continuously as illustrated in curve 301 in FIG. 3A.

In one embodiment (represented by a curve 302 in FIG. 3A and by a curve 402 in FIG. 4A), the continuous inhomogeneous aluminum nitride layer 32L may be deposited using a deposition process in which the supply of nitrogen molecules (which may be measured by the partial pressure of reactive nitrogen-containing molecules during a reactive sputtering process) increases stepwise as illustrated in curve 402 in FIG. 4A, and the atomic percentage of nitrogen in the continuous inhomogeneous aluminum nitride layer 32L increases stepwise as illustrated in curve 302 in FIG. 3A.

Referring to FIGS. 2B, 3B, and 4B, a second configuration of the continuous inhomogeneous aluminum nitride layer 32L, the vertical cross-sectional profile of the atomic percentage of nitrogen in the second configuration of the continuous inhomogeneous aluminum nitride layer 32L, and a graph representing the partial pressure of reactive nitrogen-containing molecules as a function of time during a reactive sputtering process used to deposit the second configuration of the continuous inhomogeneous aluminum nitride layer 32L are shown, respectively.

In the second configuration, the continuous inhomogeneous aluminum nitride layer 32L comprises a vertical stack of component aluminum nitride layers (32A, 32B) that are arranged along the vertical direction. Specifically, the continuous inhomogeneous aluminum nitride layer 32L comprises first component aluminum nitride layers 32A that are interlaced with second component aluminum nitride layers 32B along the vertical direction. Each of the first component aluminum nitride layers 32A comprises a first aluminum nitride material including nitrogen atoms at a first average atomic percentage, and each of the second component aluminum nitride layers 32B comprises a second aluminum nitride material including nitrogen atoms at a second average atomic percentage that is greater than the first average atomic percentage. In one embodiment, the first average atomic percentage may be in a range from 45% to 49%, and the second average atomic percentage may be in a range from 49% to 50%.

In one embodiment, the continuous inhomogeneous aluminum nitride layer 32L is formed with a non-uniform vertical nitrogen concentration profile such that an atomic percentage of nitrogen atoms in the continuous inhomogeneous aluminum nitride layer 32L includes at least two local peaks as a function of a vertical distance from an interface with the heater line 30.

In some embodiments, the atomic percentage of nitrogen atoms in the first component aluminum nitride layers 32A may have a respective peak within each of the first component aluminum nitride layers 32A. The maximum value of the atomic percentage of nitrogen atoms in the first component aluminum nitride layers 32A within each peak may be located at a single value of a vertical distance from a top surface of the heater material layer 30L (as in the embodiment of a point peak in the profile illustrated in FIG. 3B), or may be located within a range of vertical distances in embodiments in which the profile of the atomic percentage of nitrogen contains a plateau at a respective peak. In this embodiment, peak-to-peak distances in the vertical profile of the atomic percentage of nitrogen may be defined using one or more single-point peaks and/or using a mid-point of a plateau at which the atomic percentage of nitrogen is at a maximum value as a function of a vertical distance from the top surface of the heater material layer 30. In other words, in embodiments in which a vertical profile of the atomic percentage of nitrogen contains a plateau at a maximum, a mid-point location is used for the purpose of measurement of a peak-to-peak distance between neighboring pairs of peaks in the vertical profile of the atomic percentage of nitrogen.

In one embodiment, the thicknesses of the first component aluminum nitride layers 32A may be different from one another. In one embodiment, the thickness of the first component aluminum nitride layers 32A may decrease with a vertical distance from the top surface of the heater material layer 30L. In other words, a first component aluminum nitride layer 32A that is distal from the heater material layer 30L may have a lesser thickness than a first component aluminum nitride layer 32A that is proximal to the heater material layer 30L.

In one embodiment, the vertical profile for the atomic concentration of nitrogen may have two or more peaks, and/or may have three or more peaks. The peak-to-peak distance between neighboring pairs of peaks in the vertical profile of the atomic percentage of nitrogen may decrease with a vertical distance from the top surface of the heater material layer 30L. In one embodiment, peak atomic percentages of the at least two local peaks may be the same irrespective of the vertical distance from the heater material layer 30L. In one embodiment, the peak atomic percentages may be 50%. In one embodiment, the multiple local peaks in the atomic percentage of nitrogen may have a same magnitude (such as 50%).

In one embodiment, the continuous inhomogeneous aluminum nitride layer 32L may be formed with a non-uniform vertical nitrogen concentration profile such that an atomic percentage of nitrogen atoms in the continuous inhomogeneous aluminum nitride layer 32L includes at least three local peaks as a function of a vertical distance from an interface with the heater material layer 30L, and a peak-to-peak distance between neighboring peaks selected from the at least three local peaks is less for a local peak selected from the at least three local peaks that is most distal from the heater material layer 30L than for a local peak selected from the at least three local peaks that is most proximal to the heater material layer 30L. In other words, a peak-to-peak distance between neighboring peaks selected from the at least three local peaks is less for a local peak selected from the at least three local peaks that is most distal from the heater material layer 30L than for a local peak selected from the at least three local peaks that is most proximal to the heater material layer 30L.

During the deposition process that forms the continuous inhomogeneous aluminum nitride layer 32L, the partial pressure of reactive nitrogen-containing molecules in a reactive sputtering apparatus as a function of time (as illustrated in FIG. 4B) may have multiple local peaks, which comprise at least two local peaks and/or least three local peaks. In one embodiment, the multiple local peaks may comprise at least three local peaks, and a peak-to-peak time between neighboring peaks selected from the at least three local peaks is less for a last local peak selected from the at least three local peaks than for an initial local peak selected from the at least three local peaks.

Figure 2D:
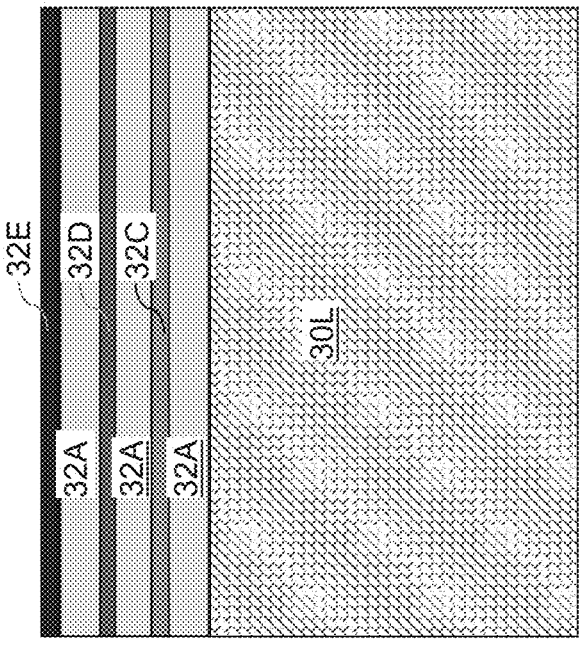
Figure 2C:
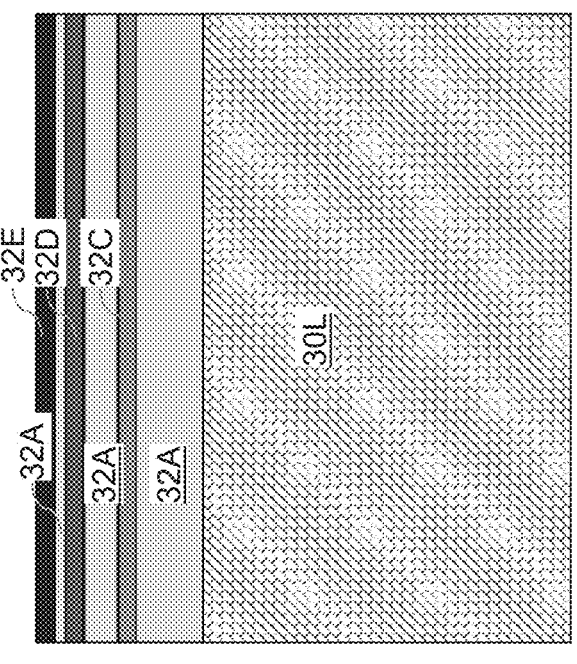
Figures 4C, 4D:
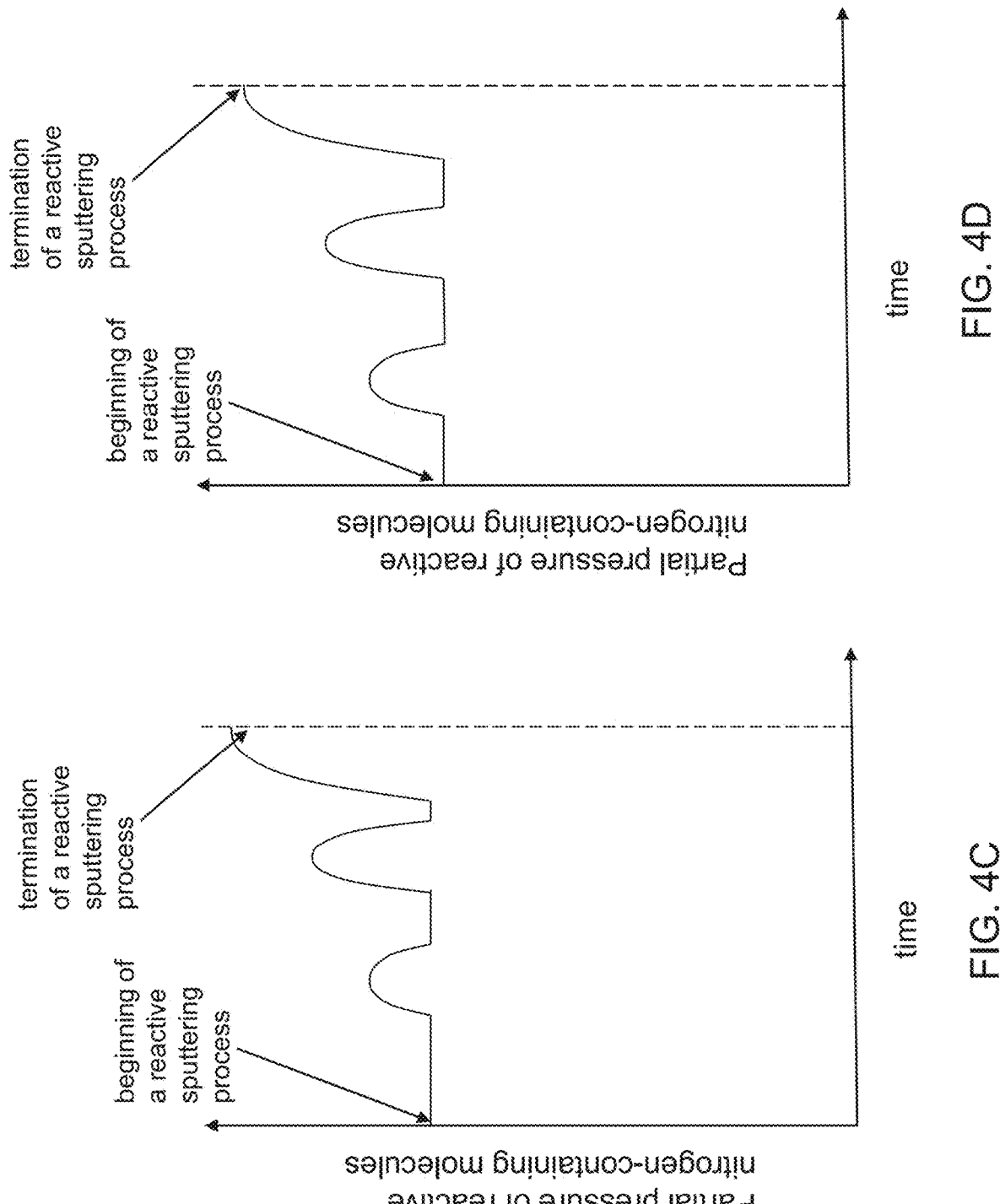

Referring to FIGS. 2C, 3C, and 4C, a third configuration of the continuous inhomogeneous aluminum nitride layer 32L, the vertical cross-sectional profile of the atomic percentage of nitrogen in the third configuration of the continuous inhomogeneous aluminum nitride layer 32L, and a graph representing the partial pressure of reactive nitrogen-containing molecules as a function of time during a reactive sputtering process used to deposit the third configuration of the continuous inhomogeneous aluminum nitride layer 32L are shown, respectively.

The third configuration of the continuous inhomogeneous aluminum nitride layer 32L may be derived from the second configuration of the continuous inhomogeneous aluminum nitride layer 32L by using stepwise increase in the atomic percentage of nitrogen in consecutive second component aluminum nitride layers (32C, 32D, 32E). The first component aluminum nitride layers 32A may include nitrogen atoms at a first atomic percentage, the second component aluminum nitride layers (32C, 32D, 32E) may comprise a proximal second component aluminum nitride layer 32C including nitrogen atoms at a second atomic percentage that is greater than the first atomic percentage, an intermediate second component aluminum nitride layer 32D including nitrogen atoms at a third atomic percentage that is greater than the second atomic percentage, and a distal second component aluminum nitride layer 32E including nitrogen atoms at a fourth atomic percentage that is greater than the third atomic percentage. In one embodiment, the fourth atomic percentage may be 50%.

The atomic concentration of nitrogen as a function of a vertical distance from the heater material layer 30L includes at least two local peaks within the continuous inhomogeneous aluminum nitride layer 32L. In one embodiment, the thicknesses of the first component aluminum nitride layers 32A may be different from one another. In one embodiment, the thickness of the first component aluminum nitride layers 32A may decrease with a vertical distance from the top surface of the heater material layer 30L. In other words, a first component aluminum nitride layer 32A that is distal from the heater material layer 30L may have a lesser thickness than a first component aluminum nitride layer 32A that is proximal to the heater material layer 30L.

In one embodiment, the vertical profile for the atomic concentration of nitrogen may have two or more peaks, and/or may have three or more peaks. The peak-to-peak distance between neighboring pairs of peaks in the vertical profile of the atomic percentage of nitrogen may decrease with a vertical distance from the top surface of the heater material layer 30L. In one embodiment, peak atomic percentages of the at least two local peaks (and/or at least three local peaks) increase with the vertical distance from the interface with the heater material layer 30L. In one embodiment, each of the multiple local peaks other than an initial local peak (i.e., a local peak that is most proximal to the heater material layer 30L) has a respective magnitude that is greater than a magnitude of a preceding local peak selected from the multiple local peaks.

In one embodiment, the continuous inhomogeneous aluminum nitride layer 32L may be formed with a non-uniform vertical nitrogen concentration profile such that an atomic percentage of nitrogen atoms in the continuous inhomogeneous aluminum nitride layer 32L includes at least three local peaks as a function of a vertical distance from an interface with the heater material layer 30L, and a peak-to-peak distance between neighboring peaks selected from the at least three local peaks is less for a local peak selected from the at least three local peaks that is most distal from the heater material layer 30L than for a local peak selected from the at least three local peaks that is most proximal to the heater material layer 30L. In other words, a peak-to-peak distance between neighboring peaks selected from the at least three local peaks is less for a local peak selected from the at least three local peaks that is most distal from the heater material layer 30L than for a local peak selected from the at least three local peaks that is most proximal to the heater material layer 30L.

During the deposition process that forms the continuous inhomogeneous aluminum nitride layer 32L, the partial pressure of reactive nitrogen-containing molecules in a reactive sputtering apparatus as a function of time (as illustrated in FIG. 4C) may have multiple local peaks, which comprise at least two local peaks and/or least three local peaks. In one embodiment, the multiple local peaks may comprise at least three local peaks, and a peak-to-peak time between neighboring peaks selected from the at least three local peaks is less for a last local peak selected from the at least three local peaks than for an initial local peak selected from the at least three local peaks.

Referring to FIGS. 2D, 3D, and 4D, a fourth configuration of the continuous inhomogeneous aluminum nitride layer 32L, the vertical cross-sectional profile of the atomic percentage of nitrogen in the fourth configuration of the continuous inhomogeneous aluminum nitride layer 32L, and a graph representing the partial pressure of reactive nitrogen-containing molecules as a function of time during a reactive sputtering process used to deposit the fourth configuration of the continuous inhomogeneous aluminum nitride layer 32L are shown, respectively.

The fourth configuration of the continuous inhomogeneous aluminum nitride layer 32L may be derived from the third configuration of the continuous inhomogeneous aluminum nitride layer 32L by equalizing all peak-to-peak distances in the profile of the atomic percentage of nitrogen as a function of a vertical distance from a top surface of the heater material layer 30L, and/or by equalizing all peak-to-peak times in the profile of the partial pressure of reactive nitrogen-containing molecules as a function of time. The first component aluminum nitride layers 32A may include nitrogen atoms at a first atomic percentage, the second component aluminum nitride layers (32C, 32D, 32E) may comprise a proximal second component aluminum nitride layer 32C including nitrogen atoms at a second atomic percentage that is greater than the first atomic percentage, an intermediate second component aluminum nitride layer 32D including nitrogen atoms at a third atomic percentage that is greater than the second atomic percentage, and a distal second component aluminum nitride layer 32E including nitrogen atoms at a fourth atomic percentage that is greater than the third atomic percentage. In one embodiment, the fourth atomic percentage may be 50%.

Figure 2F:
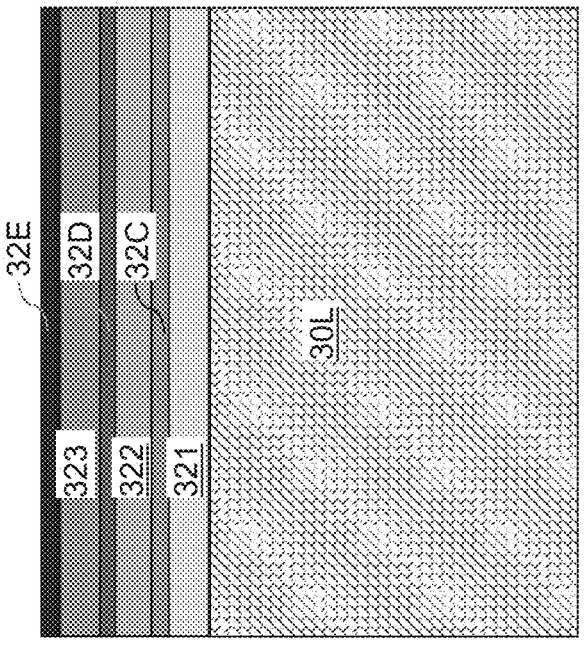
Figure 2E:
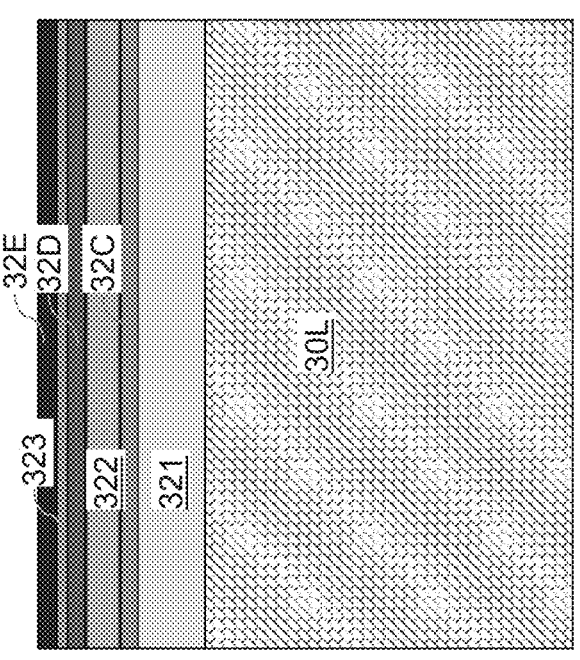
Figures 3E, 3F:
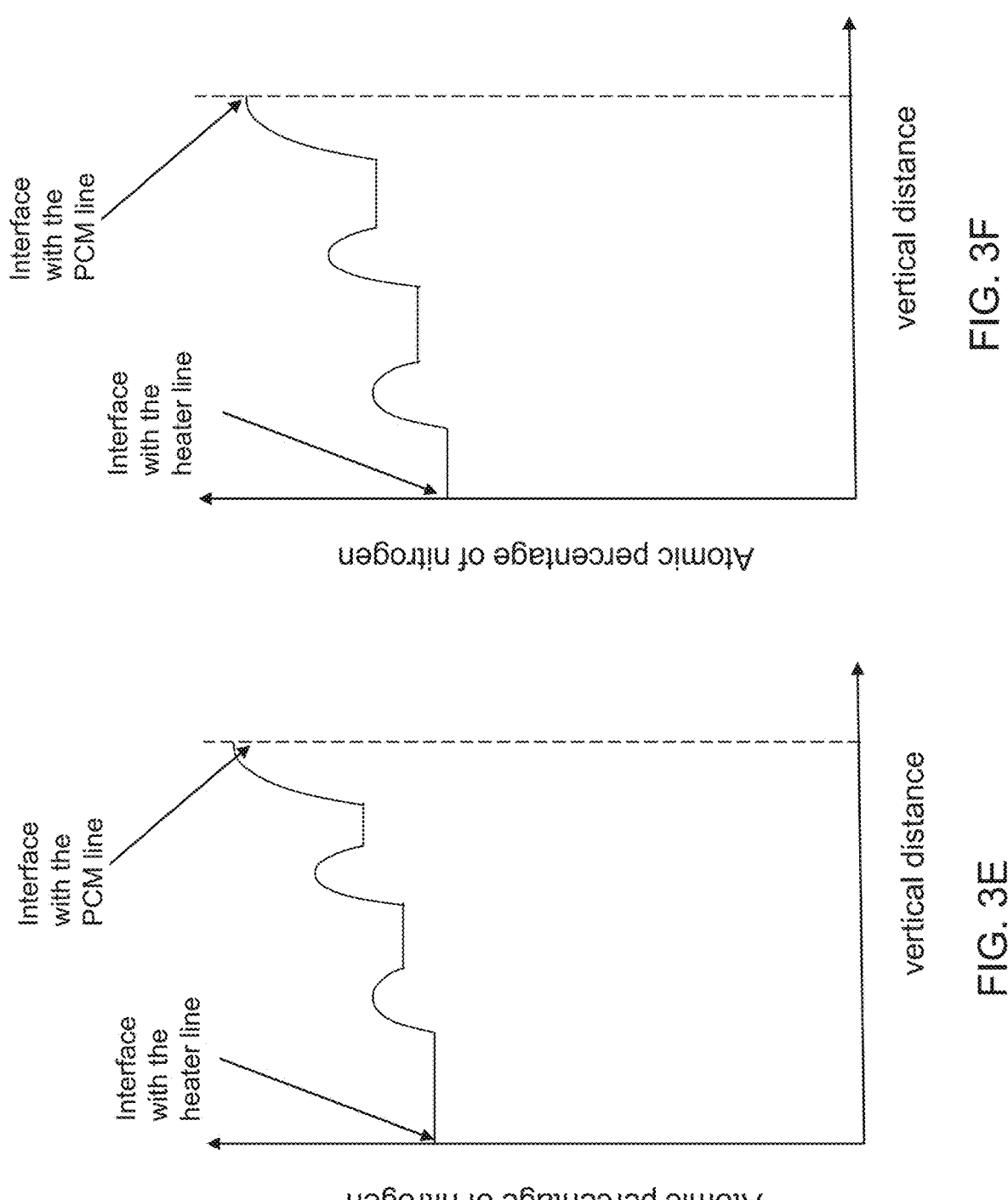
Figures 4E, 4F:
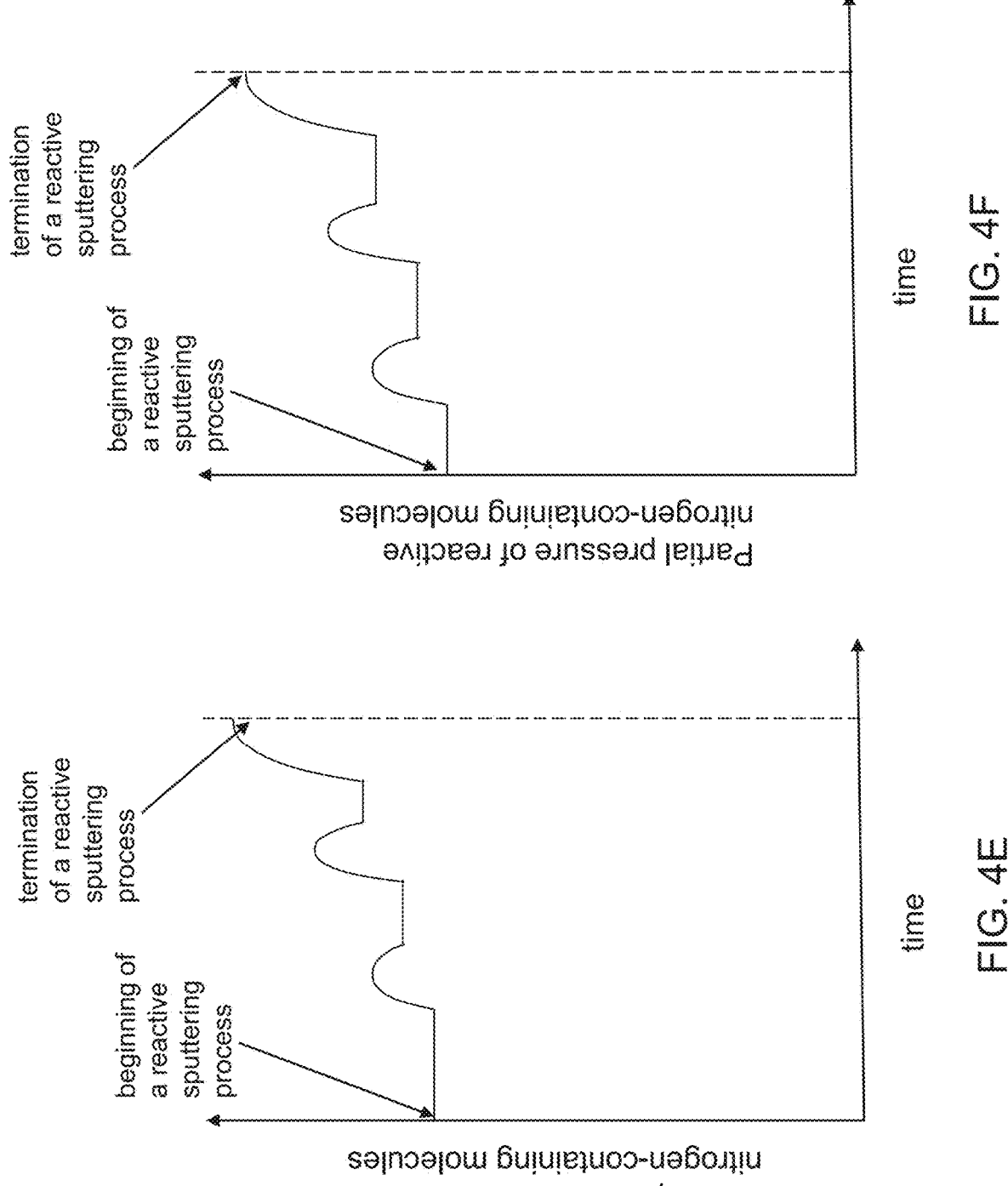

Referring to FIGS. 2E, 3E, and 4E, a fifth configuration of the continuous inhomogeneous aluminum nitride layer 32L, the vertical cross-sectional profile of the atomic percentage of nitrogen in the fifth configuration of the continuous inhomogeneous aluminum nitride layer 32L, and a graph representing the partial pressure of reactive nitrogen-containing molecules as a function of time during a reactive sputtering process used to deposit the fifth configuration of the continuous inhomogeneous aluminum nitride layer 32L are shown, respectively.

The fifth configuration of the continuous inhomogeneous aluminum nitride layer 32L may be derived from the third configuration of the continuous inhomogeneous aluminum nitride layer 32L by using stepwise increase in the atomic percentage of nitrogen in consecutive first component aluminum nitride layers (321, 322, 323). The first component aluminum nitride layers (321, 322, 323) may include nitrogen atoms at different atomic percentages. For example, the first component aluminum nitride layers (321, 322, 323) may comprise a proximal first component aluminum nitride layer 321 including nitrogen atoms at a first atomic percentage, an intermediate first component aluminum nitride layer 322 including nitrogen atoms at a third atomic percentage that is greater than the first atomic percentage, and a distal first component aluminum nitride layer 323 including nitrogen atoms at a fifth atomic percentage that is greater than the third atomic percentage. The second component aluminum nitride layers (32C, 32D, 32E) may comprise a proximal second component aluminum nitride layer 32C including nitrogen atoms at a second atomic percentage that is greater than the first atomic percentage and greater than the third atomic percentage, an intermediate second component aluminum nitride layer 32D including nitrogen atoms at a fourth atomic percentage that is greater than the second atomic percentage, the third atomic percentage, and the fifth atomic percentage, and a distal second component aluminum nitride layer 32E including nitrogen atoms at a sixth atomic percentage that is greater than the fourth atomic percentage and the fifth atomic percentage. In one embodiment, the sixth atomic percentage may be 50%.

The atomic concentration of nitrogen as a function of a vertical distance from the heater material layer 30L includes at least two local peaks within the continuous inhomogeneous aluminum nitride layer 32L. In one embodiment, the thicknesses of the first component aluminum nitride layers (321, 322, 323) may be different from one another. In one embodiment, the thickness of the first component aluminum nitride layers (321, 322, 323) may decrease with a vertical distance from the top surface of the heater material layer 30L. In other words, a first component aluminum nitride layer (such as the distal first component aluminum nitride layer 323) that is distal from the heater material layer 30L may have a lesser thickness than a first component aluminum nitride layer (such as the proximal first component aluminum nitride layer 321) that is proximal to the heater material layer 30L.

In one embodiment, the vertical profile for the atomic concentration of nitrogen may have two or more peaks, and/or may have three or more peaks. The peak-to-peak distance between neighboring pairs of peaks in the vertical profile of the atomic percentage of nitrogen may decrease with a vertical distance from the top surface of the heater material layer 30L. In one embodiment, peak atomic percentages of the at least two local peaks (and/or at least three local peaks) increase with the vertical distance from the interface with the heater material layer 30L. In one embodiment, each of the multiple local peaks other than an initial local peak (i.e., a local peak that is most proximal to the heater material layer 30L) has a respective magnitude that is greater than a magnitude of a preceding local peak selected from the multiple local peaks.

In one embodiment, the continuous inhomogeneous aluminum nitride layer 32L may be formed with a non-uniform vertical nitrogen concentration profile such that an atomic percentage of nitrogen atoms in the continuous inhomogeneous aluminum nitride layer 32L includes at least three local peaks as a function of a vertical distance from an interface with the heater material layer 30L, and a peak-to-peak distance between neighboring peaks selected from the at least three local peaks is less for a local peak selected from the at least three local peaks that is most distal from the heater material layer 30L than for a local peak selected from the at least three local peaks that is most proximal to the heater material layer 30L. In other words, a peak-to-peak distance between neighboring peaks selected from the at least three local peaks is less for a local peak selected from the at least three local peaks that is most distal from the heater material layer 30L than for a local peak selected from the at least three local peaks that is most proximal to the heater material layer 30L.

During the deposition process that forms the continuous inhomogeneous aluminum nitride layer 32L, the partial pressure of reactive nitrogen-containing molecules in a reactive sputtering apparatus as a function of time (as illustrated in FIG. 4D) may have multiple local peaks, which comprise at least two local peaks and/or least three local peaks. In one embodiment, the multiple local peaks may comprise at least three local peaks, and a peak-to-peak time between neighboring peaks selected from the at least three local peaks is less for a last local peak selected from the at least three local peaks than for an initial local peak selected from the at least three local peaks.

Referring to FIGS. 2F, 3F, and 4F, a sixth configuration of the continuous inhomogeneous aluminum nitride layer 32L, the vertical cross-sectional profile of the atomic percentage of nitrogen in the sixth configuration of the continuous inhomogeneous aluminum nitride layer 32L, and a graph representing the partial pressure of reactive nitrogen-containing molecules as a function of time during a reactive sputtering process used to deposit the sixth configuration of the continuous inhomogeneous aluminum nitride layer 32L are shown, respectively.

The sixth configuration of the continuous inhomogeneous aluminum nitride layer 32L may be derived from the fifth configuration of the continuous inhomogeneous aluminum nitride layer 32L by equalizing all peak-to-peak distances in the profile of the atomic percentage of nitrogen as a function of a vertical distance from a top surface of the heater material layer 30L, and/or by equalizing all peak-to-peak times in the profile of the partial pressure of reactive nitrogen-containing molecules as a function of time.

Referring collectively to FIGS. 2A-2F and 3A-3F, the continuous inhomogeneous aluminum nitride layer 32L of the present disclosure is generally formed with an inhomogeneous material composition such that the material composition changes along the vertical direction. A top surface portion of the continuous inhomogeneous aluminum nitride layer 32L has a higher atomic concentration of nitrogen than a bottom surface portion of the continuous inhomogeneous aluminum nitride layer 32L contacting a top surface of the heater material layer 30L.

In some configurations such as the first configuration illustrated in FIGS. 2A and 3A, an atomic percentage of nitrogen atoms in the continuous inhomogeneous aluminum nitride layer 32L increases continuously from an interface with the heater material layer 30L along the vertical direction.

In some configurations such as the second through sixth configurations illustrated in FIGS. 2B-2F and 3B-3F, an atomic percentage of nitrogen atoms in the continuous inhomogeneous aluminum nitride layer 32L includes at least two local peaks as a function of a vertical distance from an interface with the heater material layer 30L along the vertical direction. In some configurations such as the third through sixth configurations illustrated in FIGS. 2C-2F and 3C-3F, peak atomic percentages of the at least two local peaks increase with the vertical distance from the interface with the heater material layer 30L along the vertical direction.

In some configurations such as the second, third, and fifth configurations illustrated in FIGS. 2B, 2C, 2E, 3B, 3C, and 3E, an atomic percentage of nitrogen atoms in the continuous inhomogeneous aluminum nitride layer 32L includes at least three local peaks as a function of a vertical distance from an interface with the heater material layer 30L, and a peak-to-peak distance between neighboring peaks selected from the at least three local peaks is less for a local peak selected from the at least three local peaks that is most distal from the heater material layer 30L than for a local peak selected from the at least three local peaks that is most proximal to the heater material layer 30L.

In some configurations such as the second through sixth configurations illustrated in FIGS. 2B-2F, the continuous inhomogeneous aluminum nitride layer 32L comprises a vertical stack of component aluminum nitride liners (32A, 32B, 32I, 322, 323, 32C, 32D, 32E), and a vertical profile of an atomic concentration of nitrogen within the continuous inhomogeneous aluminum nitride layer 32L has multiple local peaks between a bottom surface of the continuous inhomogeneous aluminum nitride layer 32L and a top surface of the continuous inhomogeneous aluminum nitride layer 32L.

In some configurations such as the third through sixth configurations illustrated in FIGS. 2C-2F and 3C-3F, each of the multiple local peaks has a respective magnitude that increase with a vertical distance from the bottom surface of the continuous inhomogeneous aluminum nitride layer 32L. In some configurations such as the second configuration illustrated in FIGS. 2B and 3B, the multiple local peaks have a same magnitude.

Figure 5:
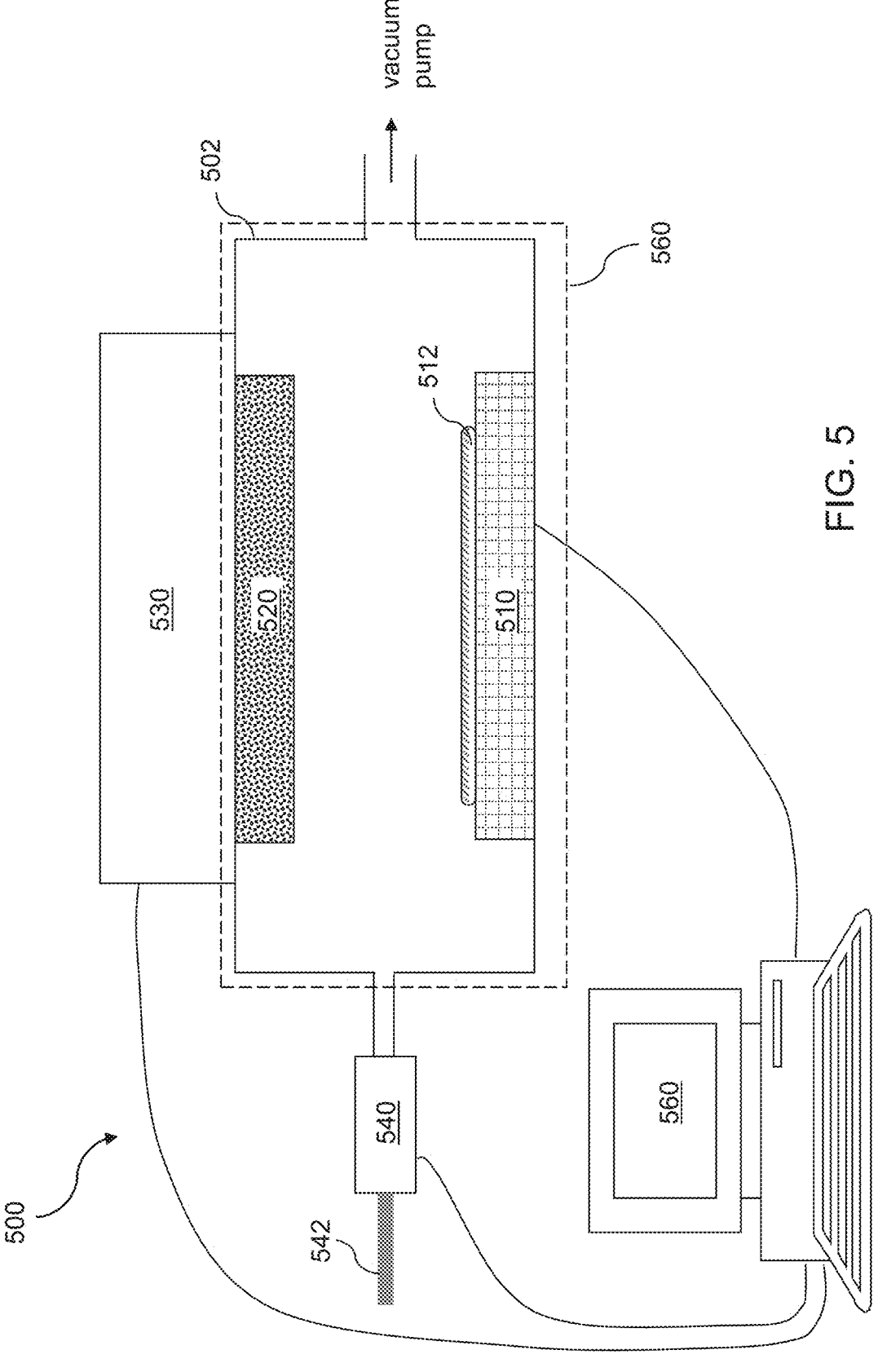
FIG. 5 is a vertical cross-sectional view of a reactive sputtering apparatus according to an embodiment of the present disclosure.

Referring to FIG. 5, a reactive sputtering apparatus 500 according to an embodiment of the present disclosure is illustrated. The reactive sputtering apparatus 500 comprises a process chamber 560. The process chamber 560 comprises a vacuum enclosure 502. A chuck 510 is provided within the vacuum enclosure 502. The chuck 510 may be configured to hold a substrate 512, such as a semiconductor substrate including multiple instances of the exemplary structure described above after formation of the heater material layer 30L and prior to formation of the continuous inhomogeneous aluminum nitride layer 32L. A sputtering target 520 may be located inside the vacuum enclosure 502, and faces the substrate 512 such that materials sputtered from the sputtering target 520 impinge on the top surface of the substrate 512. The sputtering target 520 comprises, and/or consists essentially of, aluminum. A radio-frequency (RF) generator and magnet assembly 530 is located on the vacuum enclosure 502. The RF generator and magnet assembly 530 is configured to accelerate energetic ions within the vacuum enclosure toward the sputtering target 520 through radio-frequency energy coupling.

A nitridation source gas may be connected to a mass flow controller 540 through a gas supply line 542. The nitridation source gas comprises reactive nitrogen-containing molecules which may nitridated aluminum under suitable conditions, such as upon conversion into a plasma of the nitridation source gas within the vacuum enclosure 502 during a reactive sputtering process. In one embodiment, the nitridation source gas may comprise nitrogen, ammonia, nitrogen fluoride, nitric oxide, or nitrous oxide. The mass flow controller 540 is connected to the vacuum enclosure 502 through a gas manifold, and a vacuum pump is connected to the vacuum enclosure 502 through a vacuum port.

A reactive sputtering process is a process in which metal atoms that are sputtered from a metal target (such as the aluminum target used for the sputtering target 520) reacts with a reactive gas molecules that diffuse from a discharge gas to form a compound film on a surface of a substrate. In this embodiment, the reactive sputtering process of the present disclosure may be performed while the exemplary structure described above (including the heater material layer 30L and not including the continuous inhomogeneous aluminum nitride layer 32L) is placed in the process chamber 560. Sputtered aluminum atoms and reactive nitrogen-containing molecules react inside the process chamber 560 to form the continuous inhomogeneous aluminum nitride layer 32L described above on the heater material layer 30L.

Referring collectively to FIGS. 2A-2F, 3A-3F, 4A-4F, and 5, the continuous inhomogeneous aluminum nitride layer 32L may be formed such that a top surface portion of the continuous inhomogeneous aluminum nitride layer 32L has a higher atomic concentration of nitrogen than a bottom surface portion of the continuous inhomogeneous aluminum nitride layer 32L contacting a top surface of the heater material layer 30L. According to an aspect of the present disclosure, the various profiles for the partial pressure of the reactive nitrogen-containing molecules as a function of time described with reference to FIGS. 4A-4F may be used to provide the various configurations of the continuous inhomogeneous aluminum nitride layer 32L described with reference to FIGS. 2A-2F and 3A-3F.

Referring collectively to FIGS. 4A-4F and 5 and according to embodiments of the present disclosure, the partial pressure of the reactive nitrogen-containing molecules is changed during the reactive sputtering process such that a terminal partial pressure of the reactive nitrogen-containing molecules at an end of the reactive sputtering process is greater than an initial partial pressure of the reactive nitrogen-containing molecules at a beginning of the reactive sputtering process.

In some embodiment, the partial pressure of the reactive nitrogen-containing molecules increases strictly or stepwise throughout duration of the reactive sputtering process as illustrated in FIG. 4A.

In some embodiments, the profile of the partial pressure of the reactive nitrogen-containing molecules as a function of time has multiple local peaks during the reactive sputtering process as illustrated in FIGS. 4B-4F. In some embodiments, the partial pressure of the reactive nitrogen-containing molecules as a function of time during the reactive sputtering process comprises at least two local peaks.

In some embodiments, a last local peak selected from the at least two local peaks has a greater magnitude than a local peak that is first in time selected from the at least two local peaks as illustrated in FIGS. 4C-4F.

In some embodiments, the partial pressure of the reactive nitrogen-containing molecules as a function of time during the reactive sputtering process comprises at least three local peaks, and a peak-to-peak time between neighboring peaks selected from the at least three local peaks is less for a local peak selected from the at least three local peaks that is last in time than for a local peak selected from the at least three local peaks that is first in time as illustrated in FIGS. 4B, 4C, and 4E.

In some embodiment, the partial pressure of the reactive nitrogen-containing molecules as a function of time during the reactive sputtering process comprises at least three local peaks, and minimum partial pressures of the reactive nitrogen-containing molecules between neighboring pairs of local peaks selected from the at least three local peaks increase over time during the reactive sputtering process as illustrated in FIGS. 4E and 4F.

In some embodiments, the heater material layer 30L may be formed by performing an additional reactive sputtering process while the substrate 8 and overlying structures (of which a topmost layer is the dielectric isolation layer 24) are placed in the process chamber that performs the reactive ion etch process that forms the continuous inhomogeneous aluminum nitride layer 32L. Thus, the additional reactive sputtering process may be performed prior to performing the reactive sputtering process that deposits the continuous inhomogeneous aluminum nitride layer 32L, and the total processing cost for manufacture of the heater material layer 30L and the continuous inhomogeneous aluminum nitride layer 32L can be reduced.

Figures 6A, 6B, 6C:
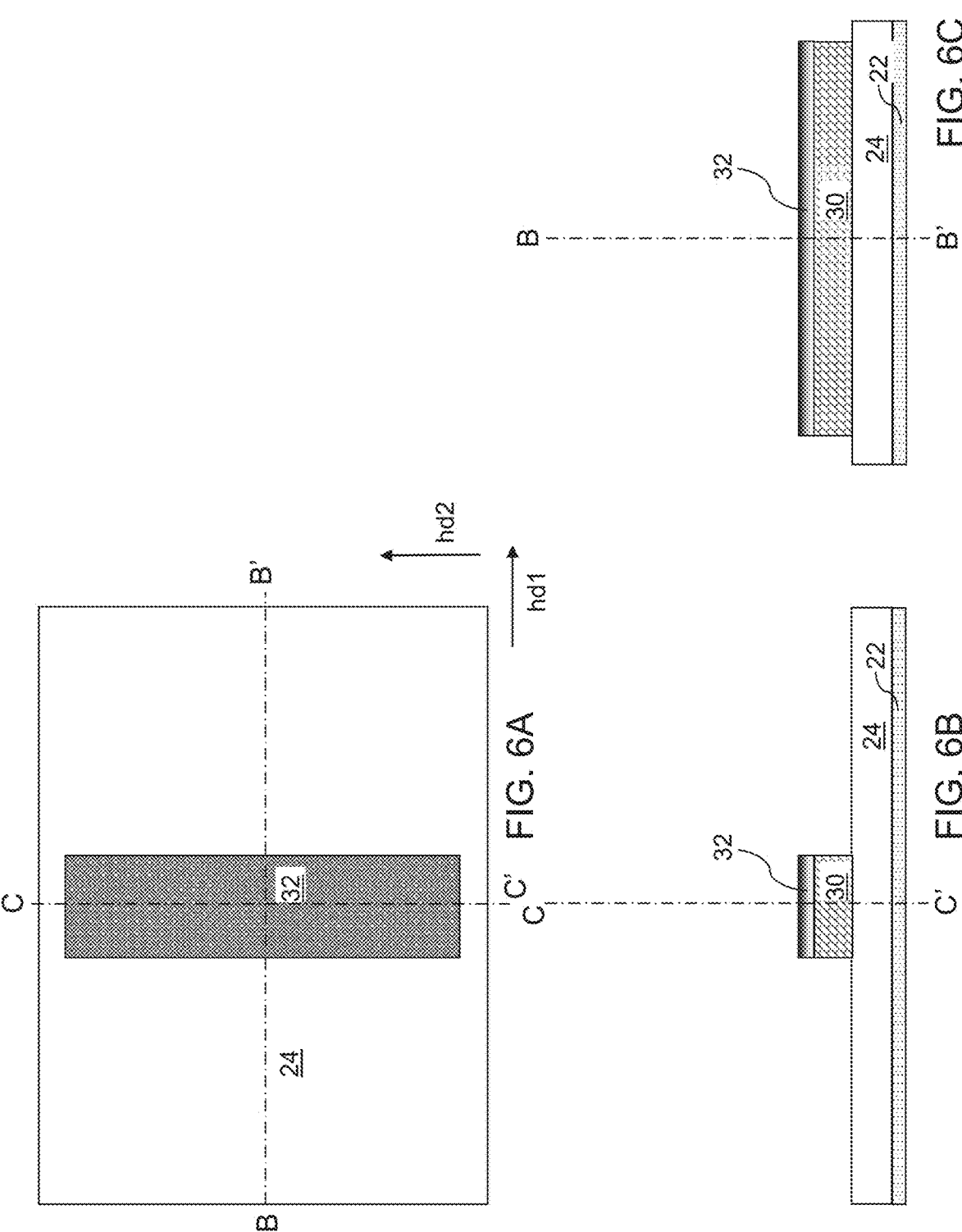
FIGS. 6A-6C are various views of the exemplary structure after patterning the continuous inhomogeneous aluminum nitride layer and the heater material layer into an inhomogeneous aluminum nitride layer and a heater line, respectively, according to an embodiment of the present disclosure.

Referring to FIGS. 6A-6C, a photoresist layer (not shown) may be applied over the continuous inhomogeneous aluminum nitride layer 32L, and may be lithographically patterned to form a discrete photoresist material portion having an elongated horizontal cross-sectional shape such as a rectangular shape. In one embodiment, the elongated shape may be a rectangular shape having a uniform width along a first horizontal direction hd1 and having a length that is greater than the uniform width along a second horizontal direction hd2.

The pattern in the patterned photoresist layer may be transferred through the continuous inhomogeneous aluminum nitride layer 32L and through the heater material layer 30L by performing an etch process. In one embodiment, an anisotropic etch process, such as a reactive ion etch process, may be performed to etch unmasked portions of the continuous inhomogeneous aluminum nitride layer 32L and the heater material layer 30L. In one embodiment, the anisotropic etch process may be selective to the material of the dielectric isolation layer 24. A remaining portion of the heater material layer 30L comprises a heater line 30, and a remaining portion of the continuous inhomogeneous aluminum nitride layer 32L comprises an inhomogeneous aluminum nitride layer 32. In one embodiment, the heater line 30 and the inhomogeneous aluminum nitride layer 32 may have the same area. The discrete photoresist material portion may be subsequently removed, for example, by ashing. The inhomogeneous aluminum nitride layer 32 contacts the top surface of the heater line 30.

Generally, a heater line 30 and an inhomogeneous aluminum nitride layer 32 may be formed over a substrate 8 such that the inhomogeneous aluminum nitride layer 32 has an inhomogeneous material composition. A top surface portion of the inhomogeneous aluminum nitride layer 32 may have a higher atomic concentration of nitrogen than a bottom surface portion of the inhomogeneous aluminum nitride layer 32 contacting a top surface of the heater line 30. The heater line 30 and the inhomogeneous aluminum nitride layer 32 laterally extend along a second horizontal direction hd2 that is perpendicular to a first horizontal direction hd1. Sidewalls of the heater line 30 may be vertically coincident with sidewalls of the inhomogeneous aluminum nitride layer 32.

Figures 7A, 7B, 7C:
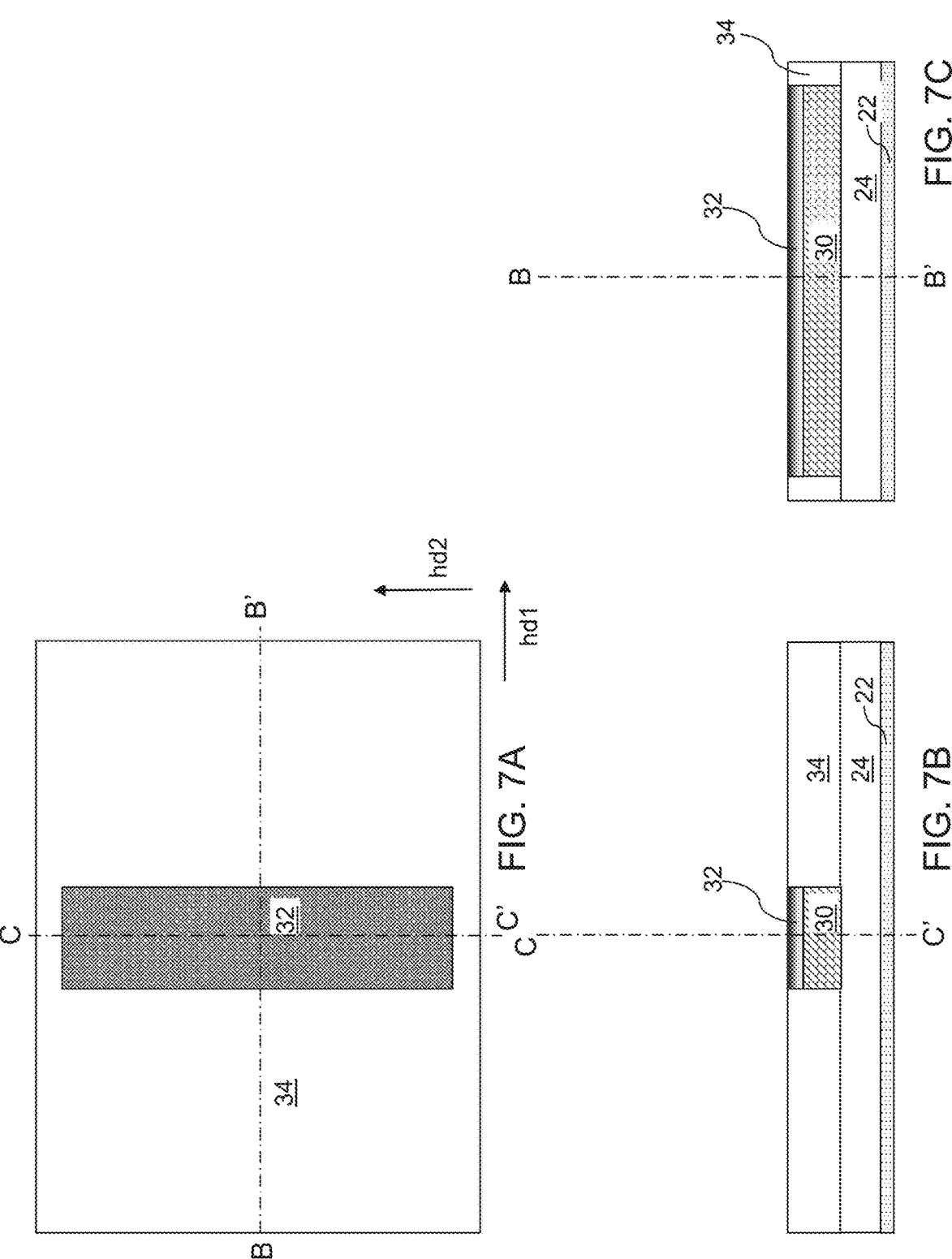
FIGS. 7A-7C are various views of the exemplary structure after formation of a dielectric matrix layer according to an embodiment of the present disclosure.

Referring to FIGS. 7A-7C, a dielectric matrix layer 34 may be formed by deposition and planarization of a dielectric material. In one embodiment, the dielectric matrix layer 34 comprises undoped silicate glass or a doped silicate glass, and may be formed, for example, by chemical vapor deposition or spin coating. Portions of the dielectric material that ae deposited above the horizontal plane including the top surface of the inhomogeneous aluminum nitride layer 32 may be removed by a planarization process, which may use a recess etch process and/or a chemical mechanical polishing process. The dielectric matrix layer 34 laterally surrounds the heater line 30 and the inhomogeneous aluminum nitride layer 32. In one embodiment, the top surface of the dielectric matrix layer 34 may be coplanar with the top surface of the inhomogeneous aluminum nitride layer 32, i.e., may be located within the horizontal plane including a top surface of the inhomogeneous aluminum nitride layer 32.

Referring to FIGS. 8A-8C, a phase change material layer 40L and a conductive barrier material layer 42L may be formed over the dielectric matrix layer 34 and the inhomogeneous aluminum nitride layer 32. As used herein, a "phase change material" refers to a material having at least two different phases providing different resistivity. A phase change material (PCM) may be used to store information as a resistivity state of a material that may be in different resistivity states corresponding to different phases of the material. The different phases may include an amorphous state having high resistivity and a crystalline state having low resistivity (i.e., a lower resistivity than in the amorphous state). The transition between the amorphous state and the crystalline state may be induced by controlling the rate of cooling after application of an electrical pulse that renders the phase change material amorphous in a first part of a programming process. The second part of the programming process includes control of the cooling rate of the phase change material. In embodiments in which rapid quenching occurs, the phase change material may cool into an amorphous high resistivity state. In embodiments in which slow cooling occurs, the phase change material may cool into a crystalline low resistivity state.

Exemplary phase change materials include, but are not limited to, germanium antimony telluride (GST) compounds such as $Ge_2Sb_2Te_5$ or $GeSb_2Te_4$, germanium antimony compounds, indium germanium telluride compounds, aluminum selenium telluride compounds, indium selenium telluride compounds, and aluminum indium selenium telluride compounds. The phase change material may be doped (e.g., nitrogen doped GST) or undoped to enhance resistance-switching characteristics. The thickness of the phase change material layer 40L (which is also referred to as a PCM material layer 40L) may be in a range from 30 nm to 600 nm, such as from 60 nm to 300 nm, although lesser and greater thicknesses may also be used.

The conductive barrier material layer 42L may include a conductive material that may function as an effective barrier against diffusion of the phase change material in the PCM material layer 40L. For example, the conductive barrier material layer 42L may comprise a carbon-based material (such as graphene or carbon nanotubes), a metallic diffusion barrier material (such as tungsten nitride, titanium nitride, tantalum nitride, or molybdenum nitride), or any other suitable conductive barrier material that may effectively suppress outdiffusion of the phase change material in the PCM material layer 40L. The thickness of the conductive barrier material layer 42L may be in a range from 5 nm to 100 nm, such as from 10 nm to 50 nm, although lesser and greater thicknesses may also be used.

The conductive barrier material layer 42L may contact the entirety of a contoured top surface of the PCM line 40. In one embodiment, the conductive barrier material layer 42L may have a contoured top surface that includes a first planar surface segment within the area of the underlying heater line 30, a second planar surface segment outside the area of vertically-extending portions of the PCM material layer 40L, and may have a convex surface segment connecting the first planar surface segment and the second planar surface segment.

Figures 9A, 9B, 9C:
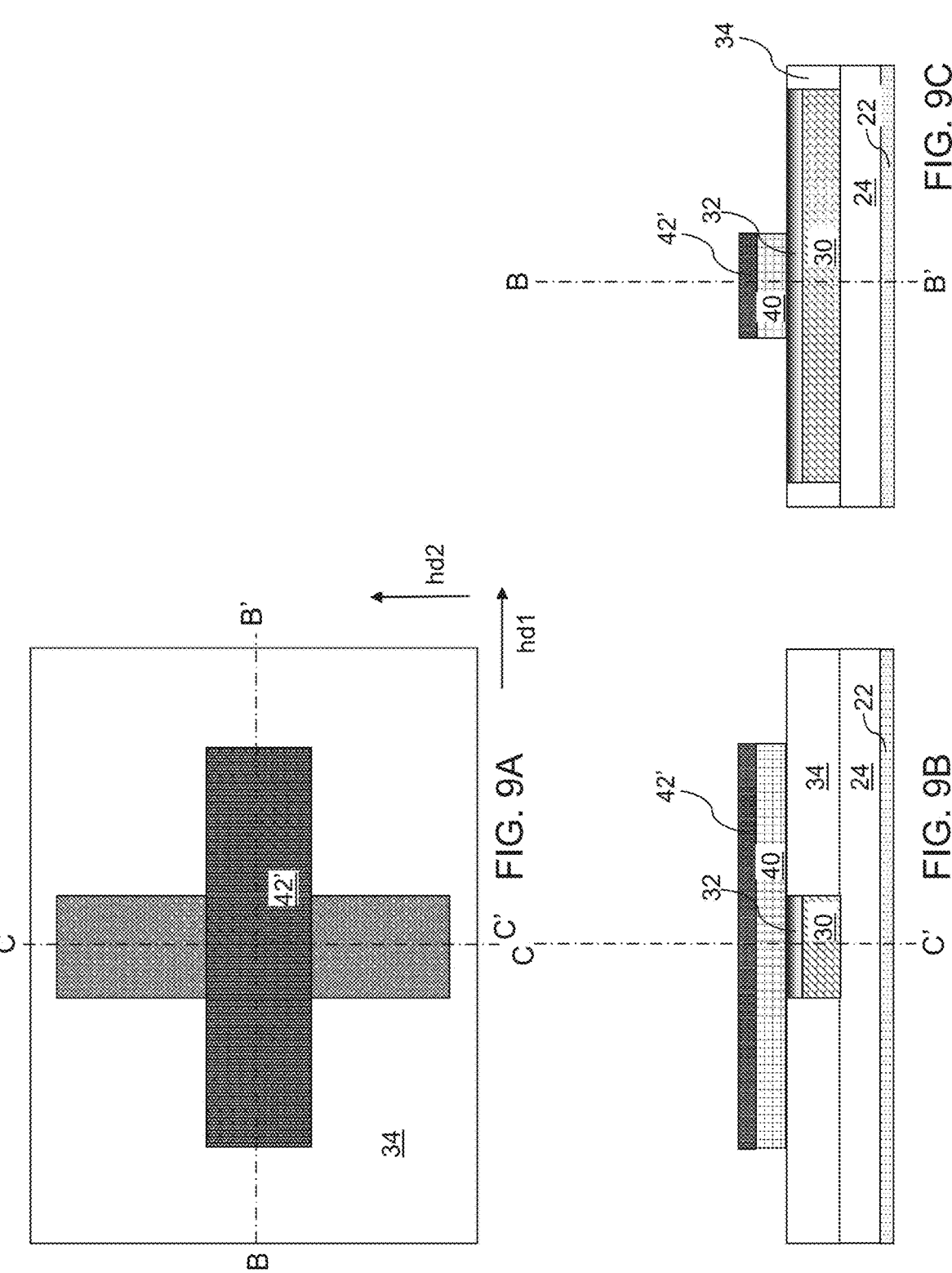
FIGS. 9A-9C are various views of the exemplary structure after formation of an in-process conductive barrier plate and a phase change material (PCM) line according to an embodiment of the present disclosure.

Referring to FIGS. 9A-9C, a photoresist layer (not shown) may be applied over the conductive barrier material layer 42L, and may be lithographically patterned to provide an elongated photoresist material portion that straddles the electrode-capping dielectric plate 52. Unmasked portions of the conductive barrier material layer 42L and unmasked portions of the PCM material layer 40L may be etched by performing an anisotropic etch process that uses the patterned photoresist material portion as an etch mask. A remaining portion of the conductive barrier material layer 42L comprises an in-process conductive barrier plate 42' (which is patterned further in subsequent processing steps). A remaining portion of the PCM material layer 40L may include a phase change material line 40, which is also referred to as a PCM line 40. The PCM line 40 laterally extends along the first horizontal direction hd1. The PCM line 40 and the in-process conductive barrier plate 42' straddle the combination of the heater line 30 and the inhomogeneous aluminum nitride layer 32. As used herein, an "in-process" element refers to an element that is modified in a subsequent processing step. The photoresist layer may be subsequently removed, for example, by ashing.

A combination including the heater line 30, the inhomogeneous aluminum nitride layer 32, the phase change material (PCM) line 40, and the in-process conductive barrier plate 42' may be formed over the dielectric isolation layer 24. The bottom surface of the heater line 30 may be formed directly on a planar top surface of the dielectric isolation layer 24. The phase change material (PCM) line 40 comprises a middle portion that overlies the heater line 30, a first end portion adjoined to a first side of the middle portion and contacting a first surface segment of the dielectric matrix layer 34, and a second end portion adjoined to a second side of the middle portion and contacting a second surface segment of the dielectric matrix layer 34. The inhomogeneous aluminum nitride layer 32 may be provided between the heater line 30 and the PCM line 40. The inhomogeneous aluminum nitride layer 32 contacts a top surface of the heater line 30. A bottom surface of the middle portion of the PCM line 40 contacts a segment of a top surface of the inhomogeneous aluminum nitride layer 32.

Referring to FIGS. 10A-10C, an electrode material layer 50L and an electrode-capping dielectric layer 52L may be deposited over the in-process conductive barrier plate 42' and the inhomogeneous aluminum nitride layer 32. The electrode material layer 50L comprises a metallic material such as a refractory metal (such as tungsten, rhenium, tantalum, niobium, or molybdenum), and may have a thickness in a range from 50 nm to 500 nm, such as from 100 nm to 300 nm, although lesser and greater thicknesses may also be used. The electrode-capping dielectric layer 52L may include a dielectric diffusion barrier material such as silicon nitride, silicon carbide, or silicon carbide nitride. Other suitable dielectric diffusion barrier materials are within the contemplated scope of disclosure. The thickness of the electrode-capping dielectric layer 52L may be in a range from 10 nm to 100 nm, such as from 20 nm to 60 nm, although lesser and greater thicknesses may also be used. The electrode material layer 50L may be formed directly on an area of the planar top surface of the dielectric matrix layer 34.

Figures 11A, 11B, 11C:
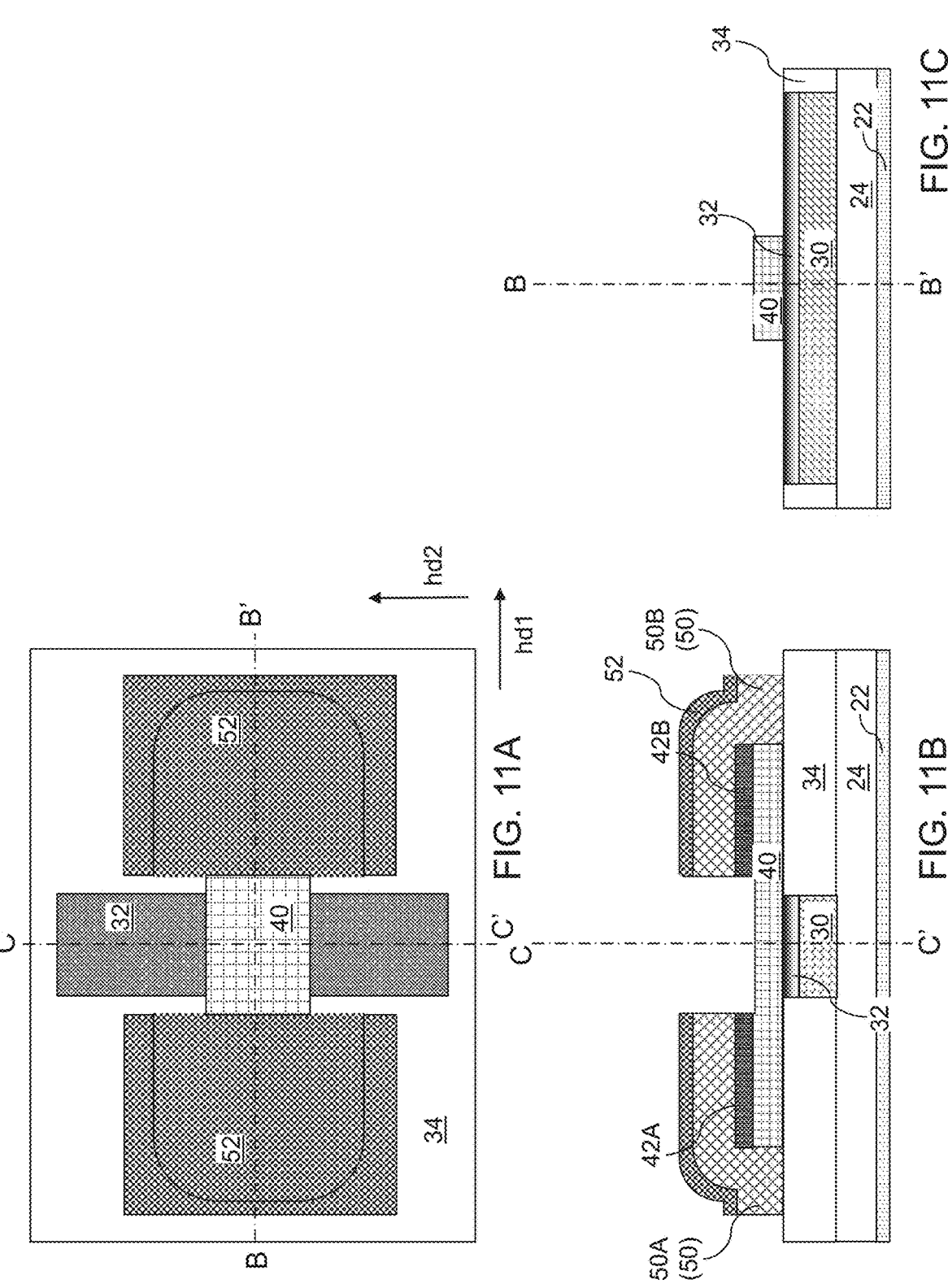
FIGS. 11A-11C are various views of the exemplary structure after formation of electrode-capping dielectric plates, electrodes, and conductive barrier plates according to an embodiment of the present disclosure.

Referring to FIGS. 11A-11C, a photoresist layer (not shown) may be applied over the electrode-capping dielectric layer 52L, and may be lithographically patterned to form two discrete photoresist material portions that overlie a respective end portion of the PCM line 40. In one embodiment, the photoresist layer may be patterned such that each patterned discrete photoresist material portion is located on a respective side of the heater line 30, and is laterally spaced apart from each other along the first horizontal direction hd1. In one embodiment, the two discrete photoresist material portions may be patterned such that the areas of the two discrete photoresist material portions cover the entirety of the contact area between the PCM line 40 and the dielectric matrix layer 34.

An anisotropic etch process may be performed to remove portions of the electrode-capping dielectric layer 52L, the electrode material layer 50L, and the in-process conductive barrier plate 42' that are not masked by the two discrete photoresist material portions. Patterned portions of the electrode material layer 50L comprise electrodes 50 for the PCM line 40. The electrodes 50 may comprise a first electrode 50A contacting three sidewalls of the first end portion of the PCM line 40 and a second electrode 50B contacting three sidewalls of the second end portion of the PCM line 40.

Patterned portions of the electrode-capping dielectric layer 52L comprise electrode-capping dielectric plates 52. Each electrode-capping dielectric layer 52 may contact the entirety of a top surface of a respective electrode 50. A horizontally-extending portion of the in-process conducive barrier plate 42' may be removed from above the area of the heater line 30. Patterned remaining portions of the in-process conductive barrier plate 42' comprise a first conductive barrier plate 42A contacting a first area of a top surface of the PCM line 40, and a second conductive barrier plate 42B contacting a second area of the top surface of the PCM line 40. The first electrode 50A contacts the first conductive barrier plate 42A, and the second electrode 50B contacts the second conductive barrier plate 42B.

In one embodiment, the first conductive barrier plate 42A contacts the first end portion of the PCM line 40. The first conductive barrier plate 42A has a first contoured top surface that includes a first horizontal surface segment underlying the first electrode 50A and a first convex surface segment extending upward from the first horizontal surface segment. The second conductive barrier plate 42B contacts the second end portion of the PCM line 40. The second conductive barrier plate 42B has a second contoured top surface that includes a second horizontal surface segment underlying the second electrode 50B and a second convex surface segment extending upward from the second horizontal surface segment.

Generally, a first electrode 50A may be formed on the first end portion of the PCM line 40, and may be formed directly on a first sidewall of the PCM line 40. A second electrode 50B may be formed on the second end portion of the PCM line 40, and may be formed directly on a second sidewall of the PCM line 40.

Referring to FIGS. 12A-12C, a dielectric material layer may be deposited over the electrodes 50 and the PCM line 40. The dielectric material layer is herein referred to as a switch-level dielectric material layer 28. Additional metal interconnect structures (652, 658) may be formed in the switch-level dielectric material layer 28. The additional metal interconnect structures (652, 658) are herein referred to as switch-level metal interconnect structures (652, 658), and may comprise switch-level metal line structures 658 and switch-level metal via structures 652.

The switch-level metal via structures 652 may comprise a first electrode contact via structure 6521 contacting the first electrode 50A, a second electrode contact via structure 6522 contacting the second electrode 50B, a first heater contact via structure 6523 contacting a first end portion of the heater line 30, and a second heater contact via structure 6524 contacting a second end portion of the heater line 30. The switch-level metal line structures 658 may comprise a first electrode connection metal line structure 6581 contacting a top surface of the first electrode contact via structure, a second electrode connection metal line structure 6582 contacting a top surface of the second electrode contact via structure 6522, a first heater connection metal line structure 6583 contacting a top surface of the first heater contact via structure 6523, and a second heater connection metal line structure 6584 contacting a top surface of the second heater contact via structure 6524.

Referring collectively to FIGS. 1-12C and generally speaking, semiconductor devices 701 may be formed on the substrate 8, and metal interconnect structures (612, 618, 622, 628, 632, 638, 642, 648) and dielectric material layers (601, 610, 620, 630, 640) may be formed over the substrate 8. The metal interconnect structures (612, 618, 622, 628, 632, 638, 642, 648) are formed in the dielectric material layers (601, 610, 620, 630, 640). The dielectric isolation layer 24 is formed over metal interconnect structures (612, 618, 622, 628, 632, 638, 642, 648). The first heater contact via structure 6523 may contact a top surface of a first end portion of the heater line 30, and may contact a sidewall of a first end portion of the PCM line 40. The second heater contact via structure 6524 may contact a top surface of a second end portion of the heater line 30, and may contact a sidewall of a second end portion of the PCM line 40.

The two end portions of the heater line 30, the first electrode 50A, and the second electrode 50B may be electrically connected to a respective one of the metal interconnect structures (612, 618, 622, 628, 632, 638, 642, 648) by forming additional metal interconnect structures (652, 658), which include additional switch-level metal via structures (not illustrated) that connect a respective one of the switch-level metal line structures 658 to a respective one of the fourth metal line structures 648.

In one embodiment, the semiconductor devices 701 comprises at least one field effect transistor configured to control flow of electrical current through the heater line 30 and to induce heating and cooling of a middle portion 40M of the heater line 30 at two different cooling rates. In one embodiment, the two different cooling rates comprises a first cooling rate that induces crystallization of the middle portion 40M of the PCM line 40 and provides the first state, and a second cooling rate that induces amorphization of the middle portion 40M of the PCM line 40 and provides the second state. In one embodiment, at least one of the semiconductor devices 701 may be electrically connected to two ends of the heater line 30. The semiconductor devices 701 may be configured to provide an electrical state selected from a first state in which the second electrode 50B is electrically shorted (i.e., electrically connected) to the first electrode 50A and a second state in which the second electrode 50B is electrically isolated from the first electrode 50A.

Generally, a first parasitic capacitance Cp1 exists between the heater line 30 and a first portion of the PCM line 40 that underlies the first electrode 50A, and a second parasitic capacitance Cp2 exists between the heater line 30 and a second portion of the PCM line 40 that underlies the second electrode 50B. According to an aspect of the present disclosure, the high electrical conductivity provided by the lower portion of the inhomogeneous aluminum nitride layer 32 provides thickening of the inhomogeneous aluminum nitride layer 32 without affecting heat distribution around the heater line 30 and the middle portion 40M of the PCM line 40. Thus, the capacitive coupling between the first end portion of the PCM line 40 and the second end portion of the PCM line 40 via the heater line 30 may be reduced, and the switch device of the present disclosure may be used for high radio-frequency switching with reduced capacitive coupling in the off state.

Referring to FIG. 13, a flowchart illustrates general processing steps for manufacturing a device structure according to an embodiment of the present disclosure.

Referring to step 1310 and FIGS. 1, 2A-2F, 3A-3F, 4A-4F, 5, and 6A-6C, a heater material layer may be formed over a substrate 8. For example, a heater line 30 and an inhomogeneous aluminum nitride layer 32 may be formed over a substrate 8. Referring to step 1320 and FIGS. 1, 2A-2F, 3A-3F, 4-4F, and 5, a reactive sputtering process may be performed while the substrate 8 and the heater material layer 30L are placed in a process chamber 560. Sputtered aluminum atoms and reactive nitrogen-containing molecules react inside the process chamber 560 to form a continuous inhomogeneous aluminum nitride layer 32L on the heater material layer 30L. The continuous inhomogeneous aluminum nitride layer 32L may be formed such that a top surface portion of the continuous inhomogeneous aluminum nitride layer 32L has a higher atomic concentration of nitrogen than a bottom surface portion of the continuous inhomogeneous aluminum nitride layer 32L contacting a top surface of the heater material layer 30L.

Referring to step 1330 and FIGS. 6A-6C, the continuous inhomogeneous aluminum nitride layer 32L and the heater material layer 30L may be patterned into an inhomogeneous aluminum nitride layer 32 and a heater line 30.

Referring to step 1340 and FIGS. 7A-12C, a phase change material (PCM) line 40 may be formed over the inhomogeneous aluminum nitride layer 32.

Referring to FIG. 14, a second flowchart that illustrates general processing steps for manufacturing a device structure according to an embodiment of the present disclosure.

Referring to step 1310 and FIG. 1, a heater material layer 30L may be formed over a substrate 8.

Referring to step 1420 and FIGS. 1, 2A-2F, 3A-3F, 4A-4F, and 5, a reactive sputtering process may be performed while the substrate 8 and the heater material layer 30L are placed in a process chamber 560. Sputtered aluminum atoms and reactive nitrogen-containing molecules react inside the process chamber 560 to form a continuous inhomogeneous aluminum nitride layer 32L on the heater material layer 30L. A profile of a partial pressure of the reactive nitrogen-containing molecules as a function of time may have multiple local peaks during the reactive sputtering process.

Referring to step 1330 and FIGS. 6A-6C, the continuous inhomogeneous aluminum nitride layer 32L and the heater material layer 30L may be patterned into an inhomogeneous aluminum nitride layer 32 and a heater line 30.

Referring to step 1340 and FIGS. 7A-12C, a phase change material (PCM) line 40 may be formed over the inhomogeneous aluminum nitride layer 32.

Referring to all drawings and according to various embodiments of the present disclosure, a switch device is provided, which comprises: a semiconductor device 701 located on a substrate 8; a heater line 30 located over the semiconductor device 701; an aluminum nitride layer 32 having an inhomogeneous material composition, wherein a top surface portion of the aluminum nitride layer 32 has a higher atomic concentration of nitrogen than a bottom surface portion of the aluminum nitride layer 32 contacting a top surface of the heater line 30; a phase change material (PCM) line 40 that straddles over the aluminum nitride layer 32; a first electrode 50A contacting the first end portion of the PCM line 40; and a second electrode 50B contacting the second end portion of the PCM line 40, wherein the semiconductor device 701 is electrically connected to two ends of the heater line 30 and to provide an electrical state selected from a first state in which the second electrode 50B is electrically shorted (i.e., electrically coupled) to the first electrode 50A and a second state in which the second electrode 50B is electrically isolated from the first electrode 50A.

In one embodiment, the semiconductor device 701 comprises at least one field effect transistor configured to control flow of electrical current through the heater line 30 and to induce heating and cooling of a middle portion 40M of the heater line 30 at two different cooling rates; and the two different cooling rates comprises a first cooling rate that induces crystallization of the middle portion 40M of the PCM line 40 and provides the first state, and a second cooling rate that induces amorphization of the middle portion 40M of the PCM line 40 and provides the second state.

In one embodiment, the switch device comprises: a first electrode contact via structure 6521 contacting the first electrode 50A; a second electrode contact via structure 6522 contacting the second electrode 50B; a first heater contact via structure 6523 contacting a first end portion of the heater line 30; and a second heater contact via structure 6524 contacting a second end portion of the heater line 30.

In one embodiment, an atomic percentage of nitrogen atoms in the aluminum nitride layer 32 includes at least two local peaks as a function of a vertical distance from an interface with the heater line 30 toward an interface with the PCM line 40.

In one embodiment, an atomic percentage of nitrogen atoms in the aluminum nitride layer 32 includes at least three local peaks as a function of a vertical distance from an interface with the heater line 30 toward an interface with the PCM line 40; and a peak-to-peak distance between neighboring peaks selected from the at least three local peaks is less for a local peak selected from the at least three local peaks that is most proximal to the PCM line 40 than for a local peak selected from the at least three local peaks that is most proximal to the heater line 30.

According to another aspect of the present disclosure, a method of forming a device structure is provided, the method comprising: forming a heater material layer 30L over a substrate 8; performing a reactive sputtering process while the substrate 8 and the heater material layer 30L are placed in a process chamber 560, wherein sputtered aluminum atoms and reactive nitrogen-containing molecules react inside the process chamber 560 to form a continuous inhomogeneous aluminum nitride layer 32L on the heater material layer 30, and the continuous inhomogeneous aluminum nitride layer 32L may be formed such that a top surface portion of the continuous inhomogeneous aluminum nitride layer 32L has a higher atomic concentration of nitrogen than a bottom surface portion of the continuous inhomogeneous aluminum nitride layer 32L contacting a top surface of the heater material layer 30L; patterning the continuous inhomogeneous aluminum nitride layer 32L and the heater material layer 30L into an inhomogeneous aluminum nitride layer 32 and a heater line 30; and forming a phase change material (PCM) line 40 over the aluminum nitride layer 32.

In one embodiment method, a partial pressure of the reactive nitrogen-containing molecules may be changed during the reactive sputtering process such that a terminal partial pressure of the reactive nitrogen-containing molecules at an end of the reactive sputtering process is greater than an initial partial pressure of the reactive nitrogen-containing molecules at a beginning of the reactive sputtering process. In one embodiment method, the partial pressure of the reactive nitrogen-containing molecules increases strictly or stepwise throughout duration of the reactive sputtering process. In one embodiment method, the partial pressure of the reactive nitrogen-containing molecules as a function of time during the reactive sputtering process comprises at least two local peaks. In one embodiment method, a last local peak selected from the at least two local peaks has a greater magnitude than a local peak that is first in time selected from the at least two local peaks. In one embodiment method, the partial pressure of the reactive nitrogen-containing molecules as a function of time during the reactive sputtering process comprises at least three local peaks; and a peak-to-peak time between neighboring peaks selected from the at least three local peaks is less for a local peak selected from the at least three local peaks that is last in time than for a local peak selected from the at least three local peaks that is first in time. In one embodiment method, the partial pressure of the reactive nitrogen-containing molecules as a function of time during the reactive sputtering process comprises at least three local peaks; and minimum partial pressures of the reactive nitrogen-containing molecules between neighboring pairs of local peaks selected from the at least three local peaks increase over time during the reactive sputtering process. In an embodiment, the method may also include: forming a first electrode 50A on the first end portion of the PCM line 40; and forming a second electrode 50B on the second end portion of the PCM line 40. In one embodiment, the method may include: forming a first electrode contact via structure 6521 on the first electrode 50A; forming a second electrode contact via structure 6522 on the second electrode 50B; forming a first heater contact via structure 6583 on a first end portion of the heater line 30; and forming a second heater contact via structure 6584 on a second end portion of the heater line 30. In one embodiment, the heater material layer comprises aluminum and nitrogen; and an atomic percentage of nitrogen within the heater material layer is in a range from 0.001% to 50.000%. In another embodiment, the heater material layer may be formed by performing an additional reactive sputtering process while the substrate is placed in the process chamber and prior to performing the reactive sputtering process.

According to another aspect of the present disclosure, a method of forming a device structure is provided, the method comprising: forming a heater material layer 30L over a substrate 8; performing a reactive sputtering process while the substrate 8 and the heater material layer 30L are placed in a process chamber 560, wherein sputtered aluminum atoms and reactive nitrogen-containing molecules react inside the process chamber 560 to form a continuous inhomogeneous aluminum nitride layer 32L on the heater material layer 30L, and a profile of a partial pressure of the reactive nitrogen-containing molecules as a function of time has multiple local peaks during the reactive sputtering process; patterning the continuous inhomogeneous aluminum nitride layer 32L and the heater material layer 30L into an inhomogeneous aluminum nitride layer 32 and a heater line 30; and forming a phase change material (PCM) line 40 over the aluminum nitride layer 32.

In one embodiment method, each of the multiple local peaks other than an initial local peak has a respective magnitude that is greater than a magnitude of a preceding local peak selected from the multiple local peaks. In one embodiment method, the multiple local peaks have a same magnitude. In one embodiment method, the multiple local peaks comprise least three local peaks; and a peak-to-peak time between neighboring peaks selected from the at least three local peaks is less for a last local peak selected from the at least three local peaks than for an initial local peak selected from the at least three local peaks. In one embodiment, the method may also include: forming a patterned photoresist layer over the continuous inhomogeneous aluminum nitride layer 32L; transferring a pattern in the patterned photoresist layer through the continuous inhomogeneous aluminum nitride layer 32L and through the heater material layer 30L by performing an etch process, wherein a patterned portion of the continuous inhomogeneous aluminum nitride layer 32L comprises the inhomogeneous aluminum nitride layer 32, and a patterned portion of the heater material layer 30L comprises the heater line 30; and forming a dielectric matrix layer 34 around the inhomogeneous aluminum nitride layer 32 and the heater line 30, wherein the PCM line 40 is formed over the inhomogeneous aluminum nitride layer 32.

According to another aspect of the present disclosure, a switch device may be provided, the switch device may include: a semiconductor device 701 located on a substrate 8; a heater line 30 located over the semiconductor device 701; an aluminum nitride layer 32 having an inhomogeneous material composition, wherein a top surface portion of the aluminum nitride layer 32 has a higher atomic concentration of nitrogen than a bottom surface portion of the aluminum nitride layer 32 contacting a top surface of the heater line 30; a phase change material (PCM) line 40 that straddles over the aluminum nitride layer 32; a first electrode 50A contacting the first end portion of the PCM line 40; and a second electrode 50B contacting the second end portion of the PCM line 40, wherein the semiconductor device 701 may be electrically connected to two ends of the heater line 30 and is configured to provide an electrical state selected from a first state in which the second electrode 50B is electrically coupled to the first electrode 50A and a second state in which the second electrode 50B is electrically isolated from the first electrode 50A.

In one embodiment, the semiconductor device 701 comprises at least one field effect transistor configured to control flow of electrical current through the heater line 30 and to induce heating and cooling of a middle portion of the heater line 30 at two different cooling rates; and the two different cooling rates comprises a first cooling rate that induces crystallization of the middle portion of the PCM line 40 and provides the first state, and a second cooling rate that induces amorphization of the middle portion of the PCM line 40 and provides the second state. In one embodiment, a first electrode contact via structure 6521 contacting the first electrode 50A; a second electrode contact via structure 6522 contacting the second electrode 50B; a first heater contact via structure 6583 contacting a first end portion of the heater line 30; and a second heater contact via structure 6584 contacting a second end portion of the heater line 30. In one embodiment, an atomic percentage of nitrogen atoms in the aluminum nitride layer 32 includes at least two local peaks as a function of a vertical distance from an interface with the heater line toward an interface with the PCM line 40. In one embodiment, an atomic percentage of nitrogen atoms in the aluminum nitride layer 32 includes at least three local peaks as a function of a vertical distance from an interface with the heater line 30 toward an interface with the PCM line 40; and a peak-to-peak distance between neighboring peaks selected from the at least three local peaks is less for a local peak selected from the at least three local peaks that is most proximal to the PCM line 40 than for a local peak selected from the at least three local peaks that is most proximal to the heater line 30.

The various embodiment phase change material devices may be used as a phase change material (PCM) switch device, which may provide at least two different resistive states between the first electrode 50A and the second electrode 50B depending on the cooling rate of the phase change material during a programming process. In a first part of a programming process, sufficient electrical current may flow through the heater to raise the temperature of a middle portion of the PCM line 40 close to the melting point of the PCM material within the PCM line 40. In a second part of the programming process, the rate of decrease in the electrical current may be selected either to induce crystallization of the PCM material in the middle portion of the PCM line 40, or to induce amorphous solidification of the PCM material in the middle portion of the PCM line 40. In embodiments in which the middle portion of the PCM line 40 is in a crystalline state, the electrical resistance between the first electrode 50A and the second electrode 50B is in a low state. In embodiments in which the middle portion of the PCM line 40 is in an amorphous state, the electrical resistance between the first electrode 50A and the second electrode 50B is in a high state. In embodiments in which the electrical resistance between the first electrode 50A and the second electrode 50B is in the low state, the PCM switch device of the present disclosure provides an on-state (i.e., a connected state) between the first electrode 50A and the second electrode 50B. In embodiments in which the electrical resistance between the first electrode 50A and the second electrode 50B is in the high state, the PCM switch device of the present disclosure provides an off-state (i.e., a disconnected state) between the first electrode 50A and the second electrode 50B.

The various embodiment phase change material switches may be programmed multiple times into new states as needed. The phase change material switch of the present disclosure may be used to increase, or decrease, interconnected components that are arranged in a parallel connection. Such interconnected components may comprise capacitors, inductors, diodes, or any other passive or active semiconductor devices. The various phase change material switches of the present disclosure may be advantageously used to provide versatility in many applications including, but not limited to, radio-frequency (RF) applications, high power applications, consumer applications, and/or for mass storage applications.

The transition between the amorphous state and the crystalline state may be induced by controlling the rate of cooling after application of an electrical pulse that renders the phase change material amorphous in a first part of a programming process. The second part of the programming process includes control of the cooling rate of the phase change material. In embodiments in which rapid quenching occurs, the phase change material may cool into an amorphous high resistivity state. In embodiments in which slow cooling occurs, the phase change material may cool into a crystalline low resistivity state.

The various devices of the present disclosure may be used as a phase change material (PCM) radio-frequency (RF) switches that provide effective signal transmission between the first electrode 50A and the second electrode 50B in the "on" state, and provide signal disconnection with reduced capacitive coupling in the "off" state. Further, use of the inhomogeneous aluminum nitride layer 32 provides effective heat distribution and electrical isolation between the heater line 30 and the PCM line 40, and thus, may reduce the power consumption of the PCM PF switch during switching operations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a device structure, the method comprising:

forming a combination of a heater line and an inhomogeneous aluminum nitride layer over a substrate, wherein a top surface portion of the inhomogeneous aluminum nitride layer has a higher atomic concentration of nitrogen than a bottom surface portion of the inhomogeneous aluminum nitride layer; and forming a phase change material (PCM) line over the top surface portion of the inhomogeneous aluminum nitride layer, wherein the inhomogeneous aluminum nitride layer is formed by:

forming a continuous inhomogeneous aluminum nitride layer by performing a reactive sputtering process while the substrate and the heater material layer are placed in a process chamber, and by subsequently patterning a deposited inhomogeneous aluminum nitride material, wherein sputtered aluminum atoms and reactive nitrogen-containing molecules react inside the process chamber; and patterning the continuous inhomogeneous aluminum nitride layer into the inhomogeneous aluminum nitride layer.

2. The method of claim 1, wherein a partial pressure of the reactive nitrogen-containing molecules is changed during the reactive sputtering process such that a terminal partial pressure of the reactive nitrogen-containing molecules at an end of the reactive sputtering process is greater than an initial partial pressure of the reactive nitrogen-containing molecules at a beginning of the reactive sputtering process.

3. The method of claim 2, wherein the partial pressure of the reactive nitrogen-containing molecules increases strictly or stepwise throughout duration of the reactive sputtering process.

4. The method of claim 2, wherein the partial pressure of the reactive nitrogen-containing molecules as a function of time during the reactive sputtering process comprises at least two local peaks.

5. The method of claim 4, wherein a last local peak selected from the at least two local peaks has a greater magnitude than a local peak that is first in time selected from the at least two local peaks.

6. The method of claim 2, wherein:

the partial pressure of the reactive nitrogen-containing molecules as a function of time during the reactive sputtering process comprises at least three local peaks; and a peak-to-peak time between neighboring peaks selected from the at least three local peaks is less for a local peak selected from the at least three local peaks that is last in time than for a local peak selected from the at least three local peaks that is first in time.

7. The method of claim 2, wherein:

the partial pressure of the reactive nitrogen-containing molecules as a function of time during the reactive sputtering process comprises at least three local peaks; and minimum partial pressures of the reactive nitrogen-containing molecules between neighboring pairs of local peaks selected from the at least three local peaks increase over time during the reactive sputtering process.

8. The method of claim 1, further comprising:

forming a first electrode on a first end portion of the PCM line;

forming a second electrode on a second end portion of the PCM line;

forming a first electrode contact via structure over the first electrode;

forming a second electrode contact via structure over the second electrode;

forming a first heater contact via structure over a first end portion of the heater line; and forming a second heater contact via structure over a second end portion of the heater line.

9. The method of claim 1, wherein:

the heater material layer comprises aluminum and nitrogen;

an atomic percentage of nitrogen within the heater material layer is in a range from 0.001% to 50.000%; and the heater material layer is formed by performing an additional reactive sputtering process while the substrate is placed in the process chamber and prior to performing the reactive sputtering process.

10. A method of forming a device structure, the method comprising:

forming a heater material layer over a substrate;

performing a reactive sputtering process while the substrate and the heater material layer are placed in a process chamber, wherein sputtered aluminum atoms and reactive nitrogen-containing molecules react inside the process chamber to form a continuous inhomogeneous aluminum nitride layer on the heater material layer, and a profile of a partial pressure of the reactive nitrogen-containing molecules as a function of time has multiple local peaks during the reactive sputtering process;

patterning the continuous inhomogeneous aluminum nitride layer and the heater material layer into an inhomogeneous aluminum nitride layer and a heater line; and forming a phase change material (PCM) line over the inhomogeneous aluminum nitride layer.

11. The method of claim 10, wherein each of the multiple local peaks other than an initial local peak has a respective magnitude that is greater than a magnitude of a preceding local peak selected from the multiple local peaks.

12. The method of claim 11, wherein the multiple local peaks have a same magnitude.

13. The method of claim 10, wherein:

the multiple local peaks comprise least three local peaks; and a peak-to-peak time between neighboring peaks selected from the at least three local peaks is less for a last local peak selected from the at least three local peaks than for an initial local peak selected from the at least three local peaks.

14. The method of claim 10, further comprising:

patterning the continuous inhomogeneous aluminum nitride layer and the heater material layer, wherein a patterned portion of the continuous inhomogeneous aluminum nitride layer comprises the inhomogeneous aluminum nitride layer, and a patterned portion of the heater material layer comprises the heater line; and forming a dielectric matrix layer around the inhomogeneous aluminum nitride layer and the heater line, wherein the PCM line is formed over the dielectric matrix layer.

15. A method of forming a device structure, the method comprising:

depositing a heater material layer and a continuous inhomogeneous aluminum nitride layer over a substrate;

patterning the continuous inhomogeneous aluminum nitride layer and the heater material layer into an inhomogeneous aluminum nitride layer and a heater line, wherein a top surface portion of the inhomogeneous aluminum nitride layer has a higher atomic concentration of nitrogen than a bottom surface portion of the inhomogeneous aluminum nitride layer; and forming a phase change material (PCM) line over the top surface portion of the inhomogeneous aluminum nitride layer, wherein:

the continuous inhomogeneous aluminum nitride layer is deposited by performing a reactive sputtering process; and a partial pressure of the reactive nitrogen-containing molecules is changed during the reactive sputtering process such that a terminal partial pressure of the reactive nitrogen-containing molecules at an end of the reactive sputtering process is greater than an initial partial pressure of the reactive nitrogen-containing molecules at a beginning of the reactive sputtering process.

16. The method of claim 15, wherein the partial pressure of the reactive nitrogen-containing molecules increases strictly or stepwise throughout duration of the reactive sputtering process.

17. The method of claim 15, wherein the partial pressure of the reactive nitrogen-containing molecules as a function of time during the reactive sputtering process comprises at least two local peaks.

18. The method of claim 15, wherein:

the partial pressure of the reactive nitrogen-containing molecules as a function of time during the reactive sputtering process comprises at least three local peaks; and a peak-to-peak time between neighboring peaks selected from the at least three local peaks is less for a local peak selected from the at least three local peaks that is last in time than for a local peak selected from the at least three local peaks that is first in time.

19. The method of claim 15, further comprising:

patterning the continuous inhomogeneous aluminum nitride layer and the heater material layer, wherein a patterned portion of the continuous inhomogeneous aluminum nitride layer comprises the inhomogeneous aluminum nitride layer, and a patterned portion of the heater material layer comprises the heater line; and forming a dielectric matrix layer around the inhomogeneous aluminum nitride layer and the heater line, wherein the PCM line is formed over the dielectric matrix layer.

20. The method of claim 15, wherein:

the heater material layer comprises aluminum and nitrogen; an atomic percentage of nitrogen within the heater material layer is in a range from 0.001% to 50.000%; and the heater material layer is formed by performing an additional reactive sputtering process while the substrate is placed in the process chamber and prior to performing the reactive sputtering process.

* * * * *